(12) United States Patent
Shibayama et al.

(10) Patent No.: US 9,785,614 B2
(45) Date of Patent: Oct. 10, 2017

(54) FAST FOURIER TRANSFORM DEVICE, FAST FOURIER TRANSFORM METHOD, AND RECORDING MEDIUM STORING FAST FOURIER TRANSFORM PROGRAM

(71) Applicant: NEC Corporation, Minato-ku, Tokyo (JP)

(72) Inventors: Atsufumi Shibayama, Tokyo (JP); Kohei Hosokawa, Tokyo (JP)

(73) Assignee: NEC CORPORATION, Tokyo (JP)

( * ) Notice: Subject to any disclaimer, the term of this patent is extended or adjusted under 35 U.S.C. 154(b) by 148 days.

(21) Appl. No.: 14/761,995

(22) PCT Filed: Jan. 22, 2014

(86) PCT No.: PCT/JP2014/000291
§ 371 (c)(1),
(2) Date: Jul. 20, 2015

(87) PCT Pub. No.: WO2014/115540
PCT Pub. Date: Jul. 31, 2014

(65) Prior Publication Data
US 2015/0363360 A1    Dec. 17, 2015

(30) Foreign Application Priority Data

Jan. 23, 2013   (JP) ................................ 2013-010183

(51) Int. Cl.
*G06F 17/14* (2006.01)
*H03H 17/02* (2006.01)

(52) U.S. Cl.
CPC ....... *G06F 17/142* (2013.01); *H03H 17/0213* (2013.01)

(58) Field of Classification Search
None
See application file for complete search history.

(56) References Cited

U.S. PATENT DOCUMENTS 5,224,063 A * 6/1993 Matsunaga ........... G06F 17/142
708/404
5,293,330 A * 3/1994 Sayegh ................. G06F 17/142
708/406

(Continued)

FOREIGN PATENT DOCUMENTS

JP         8-137832 A       5/1996
JP         2001-56806 A     2/2001

(Continued)

OTHER PUBLICATIONS

International Search Report for PCT Application No. PCT/JP2014/000291, mailed on Apr. 22, 2014.

(Continued)

*Primary Examiner* — Michael D Yaary

(57) ABSTRACT

[Problem] A fast Fourier transform method is provided that are able to input data to be processed or output processing results in no particular order.
[Solution] It is included to perform one of a process for rearranging, based on an output order setting, a plurality of output data generated by one of a fast Fourier transform and an inverse fast Fourier transform, and a process for rearranging, based on an input order setting, a plurality of input data into one of the fast Fourier transform and the inverse fast Fourier transform.

9 Claims, 20 Drawing Sheets

(56) References Cited

U.S. PATENT DOCUMENTS 5,371,696 A * 12/1994 Sundararajan ........ G06F 17/142
708/409
2004/0039765 A1 2/2004 Nakazuru et al.

FOREIGN PATENT DOCUMENTS

JP          2010-44515 A     2/2010
JP          2012-22500 A     2/2012

OTHER PUBLICATIONS

English translation for Written opinion of PCT Application No. PCT/JP2014/000291.
J. W. Cooley, J. W. Tukey, "An Algorithm for the Machine Calculation of Complex Fourier Series," Mathematics of Computation, US, American Mathematical Society, Apr. 1965, vol. 19, No. 90, pp. 297-301.
D. P. Kolba, "A Prime Factor FFT Algorithm Using High-Speed Convolution," IEEE Trans. on Acoustics, US, IEEE Signal Processing Society, Aug. 1977, vol. 29, No. 4 , pp. 281-294.

* cited by examiner

Fig. 2

| | ps(0) | ps(1) | ps(2) | ps(3) | ps(4) | ps(5) | ps(6) | ps(7) |
|---|---|---|---|---|---|---|---|---|
| P1 | 0 | 1 | 2 | 3 | 4 | 5 | 6 | 7 |
| P2 | 8 | 9 | 10 | 11 | 12 | 13 | 14 | 15 |
| P3 | 16 | 17 | 18 | 19 | 20 | 21 | 22 | 23 |
| P4 | 24 | 25 | 26 | 27 | 28 | 29 | 30 | 31 |
| P5 | 32 | 33 | 34 | 35 | 36 | 37 | 38 | 39 |
| P6 | 40 | 41 | 42 | 43 | 44 | 45 | 46 | 47 |
| P7 | 48 | 49 | 50 | 51 | 52 | 53 | 54 | 55 |
| P8 | 56 | 57 | 58 | 59 | 60 | 61 | 62 | 63 |

CYCLE → 1, 2, 3, 4, 5, 6, 7, 8

Fig. 3

|  | qs(0) | qs(1) | qs(2) | qs(3) | qs(4) | qs(5) | qs(6) | qs(7) |
|---|---|---|---|---|---|---|---|---|
| Q1 | 0 | 8 | 16 | 24 | 32 | 40 | 48 | 56 |
| Q2 | 1 | 9 | 17 | 25 | 33 | 41 | 49 | 57 |
| Q3 | 2 | 10 | 18 | 26 | 34 | 42 | 50 | 58 |
| Q4 | 3 | 11 | 19 | 27 | 35 | 43 | 51 | 59 |
| Q5 | 4 | 12 | 20 | 28 | 36 | 44 | 52 | 60 |
| Q6 | 5 | 13 | 21 | 29 | 37 | 45 | 53 | 61 |
| Q7 | 6 | 14 | 22 | 30 | 38 | 46 | 54 | 62 |
| Q8 | 7 | 15 | 23 | 31 | 39 | 47 | 55 | 63 |

CYCLE 1, 2, 3, 4, 5, 6, 7, 8

Fig. 4

| | ps(0) | ps(1) | ps(2) | ps(3) | ps(4) | ps(5) | ps(6) | ps(7) |
|---|---|---|---|---|---|---|---|---|
| P1 | 0 | 1 | 2 | 3 | 4 | 5 | 6 | 7 |
| P8 | 56 | 57 | 58 | 59 | 60 | 61 | 62 | 63 |
| P2 | 8 | 9 | 10 | 11 | 12 | 13 | 14 | 15 |
| P7 | 48 | 49 | 50 | 51 | 52 | 53 | 54 | 55 |
| P3 | 16 | 17 | 18 | 19 | 20 | 21 | 22 | 23 |
| P6 | 40 | 41 | 42 | 43 | 44 | 45 | 46 | 47 |
| P4 | 24 | 25 | 26 | 27 | 28 | 29 | 30 | 31 |
| P5 | 32 | 33 | 34 | 35 | 36 | 37 | 38 | 39 |

CYCLE: 1, 2, 3, 4, 5, 6, 7, 8

Fig. 10

| | qs(0) | qs(1) | qs(2) | qs(3) | qs(4) | qs(5) | qs(6) | qs(7) |
|---|---|---|---|---|---|---|---|---|
| Q1 | 0 | 8 | 16 | 24 | 32 | 40 | 48 | 56 |
| Q8 | 7 | 15 | 23 | 31 | 39 | 47 | 55 | 63 |
| Q2 | 1 | 9 | 17 | 25 | 33 | 41 | 49 | 57 |
| Q7 | 6 | 14 | 22 | 30 | 38 | 46 | 54 | 62 |
| Q3 | 2 | 10 | 18 | 26 | 34 | 42 | 50 | 58 |
| Q6 | 5 | 13 | 21 | 29 | 37 | 45 | 53 | 61 |
| Q4 | 3 | 11 | 19 | 27 | 35 | 43 | 51 | 59 |
| Q5 | 4 | 12 | 20 | 28 | 36 | 44 | 52 | 60 |

CYCLE: 1, 2, 3, 4, 5, 6, 7, 8

FAST FOURIER TRANSFORM DEVICE, FAST FOURIER TRANSFORM METHOD, AND RECORDING MEDIUM STORING FAST FOURIER TRANSFORM PROGRAM

This application is a National Stage Entry of PCT/JP2014/000291 filed on Jan. 22, 2014, which claims priority from Japanese Patent Application 2013-010183 filed on Jan. 23, 2013, the contents of all of which are incorporated herein by reference, in their entirety.

TECHNICAL FIELD

The present invention relates to computational processing in digital signal processing and, in particular, to a fast Fourier transform device, a fast Fourier transform method, and a recording medium storing a fast Fourier transform program.

BACKGROUND ART

One of the most important processes in digital signal processing is a fast Fourier transform (hereinafter, called "FFT"). For example, a frequency domain equalization (FDE) technique has been known as a technique to compensate waveform distortion during signal transmission in wireless or wired communications. In the frequency domain equalization (FDE), first, time-domain signal data are converted into frequency-domain data by the fast Fourier transform, and then a filter process is performed for equalization. The filtered data are reconverted into time-domain signal data by an inverse fast Fourier transform (hereinafter, called "IFFT"), by which the waveform distortion in the original time-domain signals is compensated. Hereinafter, if FFT and IFFT are not distinguished, they are denoted by "FFT/IFFT".

A "butterfly computation" is generally used in the FFT/IFFT processing. An FFT device using the butterfly computation is described in Patent Literature 1, for example. Patent Literature 1 also describes an after-mentioned "twiddle multiplication", that is, a multiplication using a twiddle factor.

As an efficient FFT/IFFT processing method, the Cooley-Tukey butterfly computation is well known which is described in Non Patent Literature 1, for example. However, the Cooley-Tukey FFT/IFFT with a large number of points requires a complex circuit. Hence, the FFT/IFFT processing is performed which is decomposed into two smaller FFTs/IFFTs by using the Prime Factor method described in Non Patent Literature 2, for example.

FIG. 19 shows a dataflow 500 of a 64-point FFT which is decomposed into two-stage radix-8 butterfly processes by utilizing the Prime Factor method, for example. The dataflow 500 includes a data sorting process 501, radix-8 butterfly computation processes performed sixteen times in total which consist of butterfly computation processes 502 and 503, and a twiddle multiplication process 504.

In the dataflow shown in FIG. 19, the inputted time-domain data x(n) (n=0, 1, . . . , 63) are Fourier-transformed into frequency-domain signals X(k) (k=0, 1, . . . , 63) through the FFT processing. The illustration of the dataflow in FIG. 19 is partly omitted. The dataflow of IFFT processing is basically the same as that shown in FIG. 19.

Implementing the whole dataflow shown in FIG. 19 requires a huge circuit in size. Therefore, a method is generally used for implementing the whole FFT process by using a circuit implementing a part of the dataflow process repetitively depending on the necessary processing performance.

For example, in the dataflow shown in FIG. 19, if an FFT device is made as a physical circuit which performs the FFT processing on eight pieces of data in parallel (hereinafter, called "in 8-data parallel" for short), the repetitive processing with eight times in total can achieve the 64-point FFT processing.

The repetitive processing with eight times is to perform in sequence a processing corresponding to each of partial dataflows 505a to 505h performed on eight pieces of data, as described in more detail below. That is to say, first, a process corresponding to the partial dataflow 505a is performed; secondly, a process corresponding to the partial dataflow 505b, and thirdly, a process corresponding to the partial dataflow 505c (not shown) is performed. Similarly, subsequent processes are performed in sequence until a process corresponding to the eighth partial dataflow 505h. These processes achieve the 64-point FFT processing.

In the butterfly computation, the data arranged in a sequential order are read according to the order following a predetermined rule and processed. Hence, it is necessary in the butterfly computation to rearrange data, for which a random access memory (RAM) is used. An FFT device is described in Patent Literature 2, for example, in which data are rearranged using a RAM in the butterfly computation.

With regard to an FFT computation device with reduced memory usage, a speed-up technique through parallel processing in the butterfly computation is described in Patent Literature 3, for example.

CITATION LIST

Patent Literature

[PTL 1]
Japanese Unexamined Patent Application Publication No. 8-137832
[PTL 2]
Japanese Unexamined Patent Application Publication No. 2001-56806
[PTL 3]
Japanese Unexamined Patent Application Publication No. 2012-22500

Non Patent Literature

[NPL 1]
J. W. Cooley, J. W. Tukey, "An Algorithm for the Machine Calculation of Complex Fourier Series," Mathematics of Computation, US, American Mathematical Society, April 1965, Vol. 19, No. 90, pp. 297-301
[NPL 2]
D. P. Kolba, "A Prime Factor FFT Algorithm Using High-Speed Convolution," IEEE Trans. on Acoustics, US, IEEE Signal Processing Society, August 1977, Vol. 29, No. 4, pp. 281-294

SUMMARY OF INVENTION

Technical Problem

On the frequency-domain signals $X(k)$ ($k=0, 1, \ldots, N-1$) having been Fourier-transformed through an FFT processing, computations may be performed among a plurality of $X(k)$ with different values of k. A computation may be performed between two data of X(k) and X(N−k), for example. In this case, since X(k) and X(N−k) are input signals for a single computation, it is desirable to be inputted at the same cycle or an extremely close cycle. The reason is that all input signals need to be in step with each other in order to start a computation. Hence, there is a certain combination for a plurality of signals obtained by an FFT processing in which it is effective to input them into a subsequent stage at the same time or at an extremely close timing in order to speed up processes in stages following the FFT processing. In addition, in general, it is effective to determine the order of signals output to the subsequent stage so that the subsequent process may be optimized.

However, the FFT circuits described in Non Patent Literature 1 and Non Patent Literature 2 do not output signals X(k) of FFT processing results in the order taking into consideration speeding up computation in subsequent stages, but output signals X(k) of FFT processing results every time a computation is completed. Consequently, X(k) and X(N−k) can be outputted in different cycles that are apart from each other by a plurality of cycles which is more than one cycle of a minimum output interval. For example, in an extreme case, if N is equal to 128, signals such as X(0) and X(127) can be outputted apart by 127 cycles.

In such cases, in order to perform a computation between X(k) and X(N−k), it is necessary to dispose a data sorting means behind the FFT circuit to output X(k) and X(N−k) at the same cycle or close cycles.

FIG. 20 shows an example of a configuration of an FFT device 600 in which a data sorting processing circuit 602 is connected to a stage following an FFT circuit 601. As mentioned above, taking into account the fact that signals are outputted at different cycles which are apart by a cycle number close to the number of FFT points, the data sorting circuit 602 needs to include storage means to be capable of storing at least one block of data in an FFT. In addition, it is desirable that each of the processing results should be outputted to the following stage at timing or in an order which is optimized for the subsequent process.

However, since the FFT circuits described in Non Patent Literature 1 and Non Patent Literature 2 do not include data sorting circuits, it is impossible to control output timing or an output order of processing results. Thus, there is a problem of an increase in a processing delay, that is, latency for the whole process including an FFT process.

Likewise, the FFT devices described in Patent Literature 2 and Patent Literature 3 do not take into account the output timing of a plurality of results obtained by an FFT process. The FFT device described in Patent Literature 2 rearranges data to be inputted into a butterfly computation unit. The FFT computation device described in Patent Literature 3 is intended for speeding up by performing butterfly computations in parallel. However, the FFT devices described in Patent Literature 2 and Patent Literature 3 do not particularly take into account the output order of signals resulting from an FFT process. Consequently, the signals are outputted in the order that each FFT computation is completed, but the order is not always suitable for speeding up the subsequent process. Thus, also in the FFT devices described in Patent Literature 2 and Patent Literature 3, there is a problem of an increase in a processing delay for the whole process, which is similar to the above.

As mentioned above, techniques described in Non Patent Literature 1, Non Patent Literature 2, Patent Literature 2, and Patent Literature 3 have a problem that it is impossible to optimize output timing or an output order of processing results obtained by an FFT process.

It is also effective to optimize the timing or the output order of processing results when a process using results of IFFT processing is performed in a stage following the IFFT process.

In addition, there may be cases where the output order of process results in a stage preceding an FFT process or IFFT process is not optimized for the execution sequence of computations performed in an FFT process or IFFT process. In such cases, it is effective to rearrange input data from the preceding stage in order to achieve an optimum order for the FFT process or IFFT process.

Object of the Invention

The object of the present invention is to provide a fast Fourier transform circuit, a fast Fourier transform method, and a recording medium storing a fast Fourier transform program that are able to input data to be processed or output processing results in no particular order in FFT/IFFT processes in digital signal processing.

Solution to Problem

A fast Fourier transform device according to an exemplary aspect of the present invention includes a first transform unit performing one of a fast Fourier transform and an inverse fast Fourier transform, generating a plurality of first output data, and outputting the plurality of first output data in a first order; and a first data sorting processing unit rearranging the plurality of the first output data outputted in the first order, in a second order based on an output order setting.

A fast Fourier transform device according to an exemplary aspect of the present invention includes a second data sorting processing unit rearranging a plurality of second input data inputted in a third order, in a fourth order based on an input order setting; and a second transform unit performing one of a fast Fourier transform and an inverse fast Fourier transform on the plurality of the second input data rearranged in the fourth order.

A fast Fourier transform method according to an exemplary aspect of the present invention includes performing one of a process for rearranging, based on an output order setting, a plurality of output data generated by one of a fast Fourier transform and an inverse fast Fourier transform, and a process for rearranging, based on an input order setting, a plurality of input data into one of the fast Fourier transform and the inverse fast Fourier transform.

A recording medium storing a fast Fourier transform program according to an exemplary aspect of the present invention is a non-transitory recording medium storing a program making a computer included in a fast Fourier transform device operate as means for performing one of a fast Fourier transform and an inverse fast Fourier transform; and one of sorting means for rearranging, based on an output order setting, a plurality of output data generated by one of the fast Fourier transform and the inverse fast Fourier transform and sorting means for rearranging, based on an input order setting, a plurality of input data into one of the fast Fourier transform and the inverse fast Fourier transform.

Advantageous Effects of Invention

According to the present invention, it is possible to input data to be processed or output processing results in no particular order in FFT/IFFT processes in digital signal processing.

BRIEF DESCRIPTION OF DRAWINGS

FIG. 2 is a diagram illustrating datasets arranged in a sequential order in accordance with the first exemplary embodiment of the present invention.

FIG. 3 is a diagram illustrating datasets arranged in a bit reverse order in accordance with the first exemplary embodiment of the present invention.

FIG. 4 is a diagram illustrating datasets arranged in an arbitrary datasets sequential order in accordance with the first exemplary embodiment of the present invention.

FIG. 10 is a diagram illustrating datasets arranged in an arbitrary datasets bit reverse order in accordance with the third exemplary embodiment of the present invention.

DESCRIPTION OF EMBODIMENTS

A First Exemplary Embodiment

Figure 1:
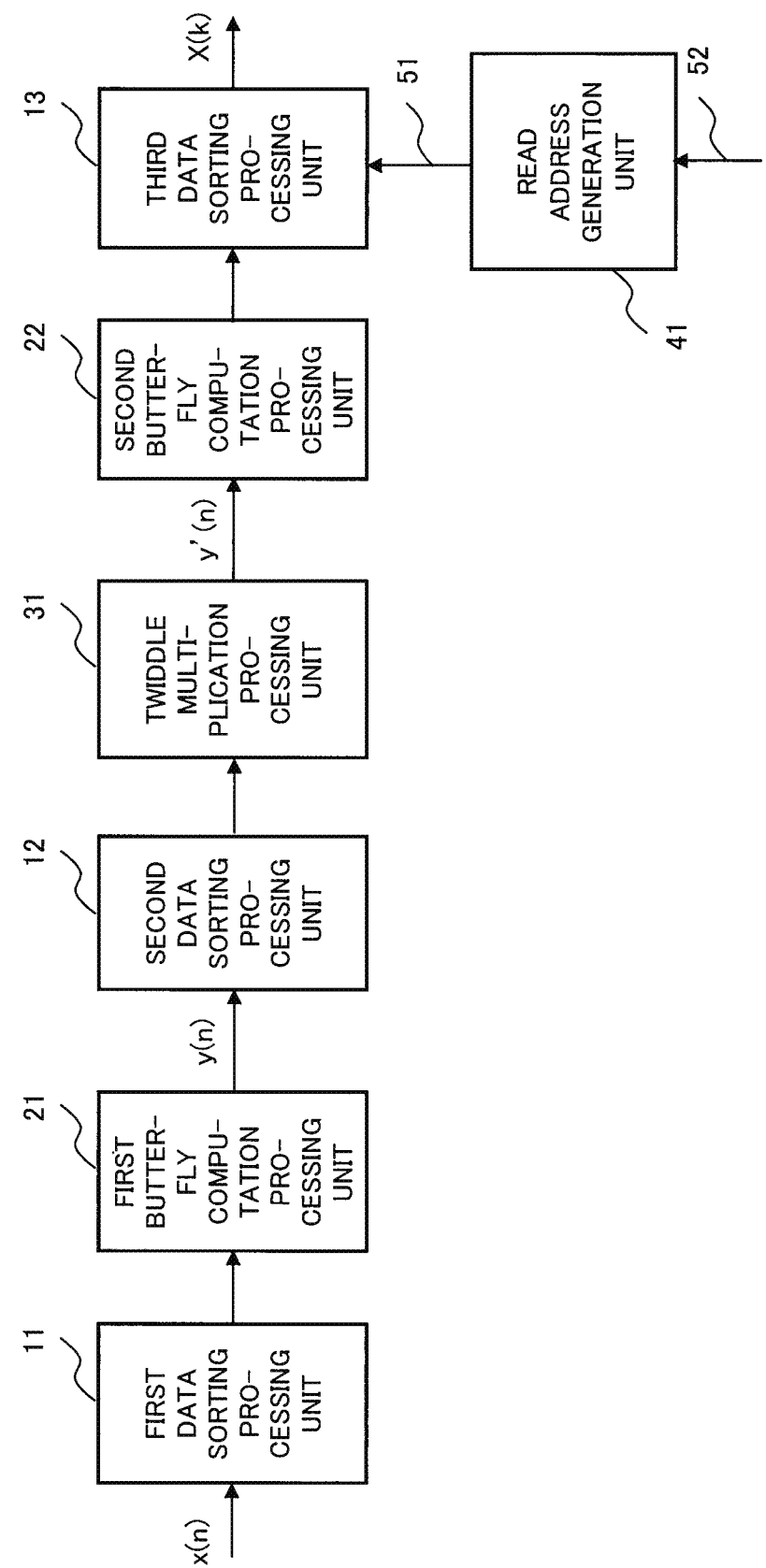
FIG. 1 is a block diagram illustrating a configuration of an FFT device 10 in accordance with a first exemplary embodiment of the present invention.

FIG. 1 is a block diagram illustrating an example of a configuration of an FFT device 10 in accordance with a first exemplary embodiment of the present invention. The FFT device 10 processes a 64-point FFT decomposed into two-stage radix-8 butterfly processes by a pipelined circuit system according to the dataflow 500 shown in FIG. 19. The FFT device 10 inputs time-domain data x(n) (n=0, 1, . . . , N−1), performs an Fourier-transformation through an FFT process on x(n), and generates and outputs frequency-domain signals X(k) (k=0, 1, . . . , N−1). Here, N is a positive integer representing the FFT block size.

It is assumed that the FFT device 10 performs a 64-point FFT process in 8-data parallel. In this case, the FFT circuit 10 inputs time-domain data x(n) and generates and outputs frequency-domain signals X(k) which have been Fourier-transformed through an FFT process. At the time, 64 pieces of data in total are inputted as input data x(n) in the order shown in FIG. 2 with eight pieces of data at a time during eight cycles. The numbers from 0 to 63 shown as contents of the table in FIG. 2 represent the index n of x(n).

Specifically, at the first cycle, eight pieces of data of x(0), x(1), . . . , and x(7) composing a dataset P1 are inputted. Next, at the second cycle, eight pieces of data of x(8), x(9), . . . , and x(15) composing a dataset P2 are inputted. Similarly, at each cycle from third one to eighth one, the data composing a dataset from P3 to P8 are inputted respectively.

Likewise, 64 pieces of data are outputted as output data X(k) in the order shown in FIG. 2 with eight pieces of data at a time during eight cycles. The numbers from 0 to 63 shown as contents of the table in FIG. 2 represent the index k of X(k).

Specifically, at the first cycle, eight pieces of data of X(0), X(1), . . . , and X(7) composing a dataset P1 are outputted. At the second cycle, eight pieces of data of X(8), X(9), . . . , and X(15) composing a dataset P2 are outputted. Similarly, at each cycle from third one to eighth one, the data composing a dataset from P3 to P8 are outputted.

The FFT device 10 includes a first data sorting processing unit 11, a first butterfly computation processing unit 21, a second data sorting processing unit 12, a twiddle multiplication processing unit 31, a second butterfly computation processing unit 22, a third data sorting processing unit 13, and a read address generation unit 41. The FFT device 10 performs pipeline processing on a first data sorting process, a first butterfly computation process, a second data sorting process, a twiddle multiplication process, a second butterfly computation process, and a third data sorting process.

The first data sorting processing unit 11 and the second data sorting processing unit 12 are buffer circuits to rearrange data. The first data sorting processing unit 11 and the second data sorting processing unit 12 respectively rearrange a data sequence before and after the first butterfly computation processing unit 21 based on data dependency in the FFT processing algorithm.

Likewise, the third data sorting processing unit 13 is a buffer circuit to rearrange data. That is to say, the third data sorting processing unit 13 rearranges a data sequence subsequent to the second butterfly computation processing unit 22 based on data dependency in the FFT processing algorithm. In addition to the above data rearrangement, the third data sorting processing unit 13 also performs a data rearrangement to output X(k) and X(N−k) at a time lag within one cycle at most for any k in the output X(k) of the FFT device 10.

Specifically, the first data sorting processing unit 11 rearranges a "sequential order" shown in FIG. 2, that is, the input order of the input data x(n), into a "bit reverse order" shown in FIG. 3 which is the order to be inputted into the first butterfly computation processing unit 21.

Figure 19:
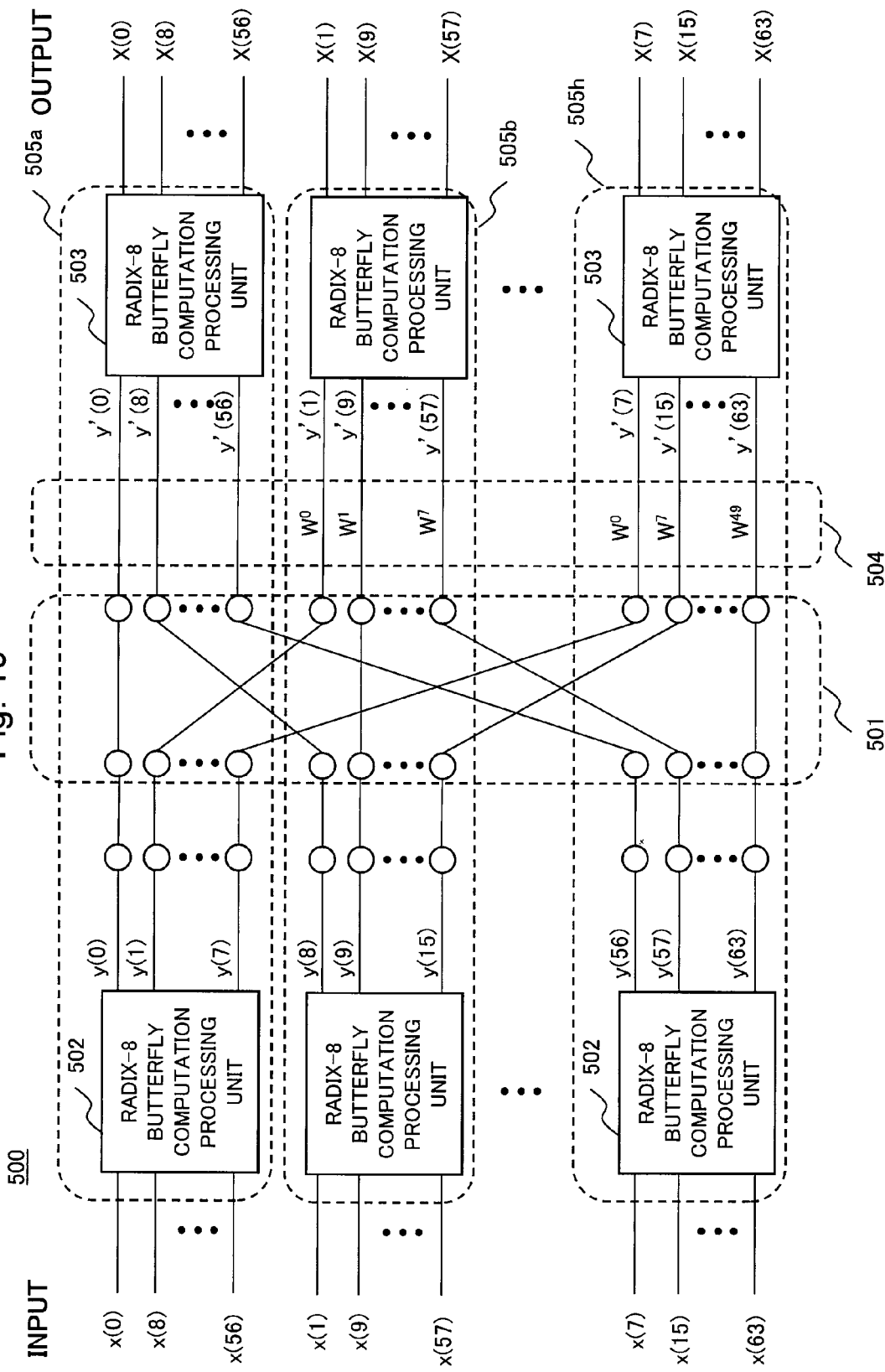
FIG. 19 is a diagram illustrating a dataflow 500 for 64-point FFT using two-stage butterfly computations.
Figure 20:
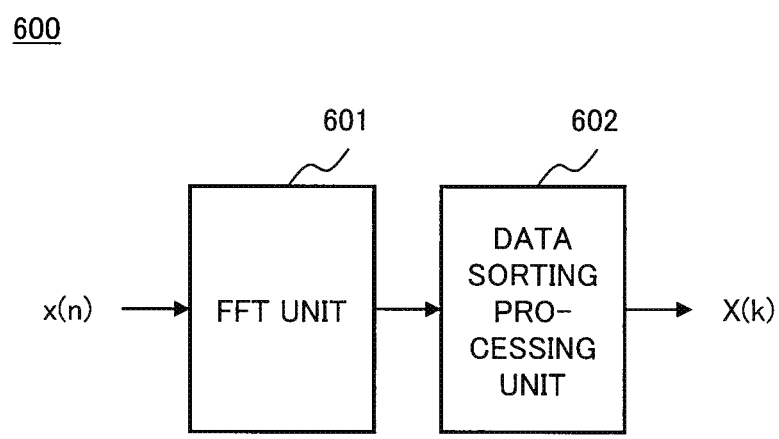
FIG. 20 is a block diagram illustrating a configuration of an FFT device 600 including a data sorting circuit.

The bit reverse order shown in FIG. 3 corresponds to the datasets to be inputted into the radix-8 butterfly process 502 in the first stage in the dataflow diagram illustrated in FIG. 19. Specifically, at the first cycle, eight pieces of data of x(0), x(8), . . . , and x(56) composing a dataset P1 are inputted. Then, at the second cycle, eight pieces of data of x(1), x(9), . . . , and x(57) composing a dataset P2 are inputted. Similarly, at each cycle from third one to eighth one, the data composing a dataset from P3 to P8 respectively are inputted.

The terms of "sequential order" and "bit reverse order" are now explained in detail. The "sequential order" means the order of eight datasets P1, P2, P3, P4, P5, P6, P7, and P8 shown in FIG. 2. A dataset Ps, where s is a value representing an order of processing cycles, and s=1, . . . , and 8, composes eight pieces of data sequentially arranged from ps(0) to ps(7), and ps(i) is expressed as follows:

$$ps(i)=8(s-1)+i$$

The respective dataset are arranged in the order of P1, P2, P3, P4, P5, P6, P7, and P8 corresponding to the progress of processing cycles. In other words, the sequential order is an order of the arrangement in which s pieces of datasets are made by arranging "is" pieces of data in the order of the data by "i" pieces of data from the first data and are arranged in the order of cycle number.

The "bit reverse order" means the order of eight datasets Q1, Q2, Q3, Q4, Q5, Q6, Q7, and Q8 shown in FIG. 3. A dataset Qs is composed of eight pieces of data from qs(0) to qs(7), and qs(i) is expressed as follows:

$$qs(i)=(s-1)+8i$$

The respective datasets are arranged in the order of Q1, Q2, Q3, Q4, Q5, Q6, Q7, and Q8 corresponding to the progress of processing cycles. In other words, the bit reverse order is an order of the arrangement in which "is" pieces of data to be inputted in a sequential order are arranged in the order of cycle number by "s" pieces of data from the first data and "i" pieces of data included in the same cycle are arranged in the order of data as one set.

As mentioned above, respective datasets arranged in the bit reverse order are uniquely determined when respective datasets in the sequential order are set. The "i"-th data composing each dataset Qs (s=1, . . . , and 8) in the bit reverse order corresponds to the "s"-th data at the cycle "i" in the sequential order. That is to say, it is expressed as follows:

$$Qs(i)=Pi(s)$$

Thus, Qs(i) and Pi(s) have a relationship in which the order in cycle progress is exchanged for the order in data position with respect to data composing each dataset. Accordingly, if the data inputted in the bit reverse order are rearranged according to the bit reverse order, they become a sequence in the sequential order.

The each line ps(i) in FIG. 2 and the eight lines qs(i) represent the data to be inputted into the "i"-th data in the subsequent stage, respectively. Each of eight numerals included in each dataset is an identifier used for identifying any one of FFT points, and is specifically an index "n" in x(n).

The rearrangement between datasets Ps in FIG. 2 and datasets Qs in FIG. 3, that is, the replacement of the correspondence relationship between respective datasets and identifiers included therein may also be performed in other data sorting circuits which will be described in following exemplary embodiments.

The sequential order and the bit reverse order are not limited to those illustrated in FIGS. 2 and 3. That is to say, the respective datasets in the sequential order can be made by arranging the data in sequence depending on the number of FFT points, the number of cycles, and the number of data processed in parallel, as described above. The respective datasets in the bit reverse order can be made by exchanging the order in cycle progress for the order in data position of the data to be inputted in the sequential order, as described above.

The first butterfly computation processing unit 21 is a butterfly circuit which performs the first round of the butterfly computation process 502 (the first butterfly computation process) of the radix-8 butterfly computation processes performed two times in the dataflow 500 shown in FIG. 19. The first butterfly computation processing unit 21 outputs the results of the butterfly computation in the sequential order shown in FIG. 2 as data y(n) (n=0, 1, . . . , 63).

The second data sorting processing unit 12 rearranges the data y(n), which are outputted from the first butterfly computation processing unit 21 in the sequential order, in the bit reverse order as shown in FIG. 3 in order to be inputted into the second butterfly computation processing unit 22.

The twiddle multiplication processing unit 31 is a circuit handling a complex rotation on the complex plane in the FFT computation after the first butterfly computation, and corresponds to the twiddle multiplication process 504 in the dataflow 500 shown in FIG. 19. The data rearrangement is not performed in the twiddle multiplication process.

The second butterfly computation processing unit 22 is a butterfly circuit which performs the second round of the radix-8 butterfly process 503 in the dataflow diagram shown in FIG. 19. The second butterfly computation processing unit 22 performs the butterfly computation on the data y'(n) (n=0, 1, . . . , 63) to be inputted in the bit reverse order after the twiddle multiplication, and outputs the results X(k) (k=0, 1, . . . , 63) in the bit reverse order just the same.

The third data sorting processing unit 13 rearranges the data X(k), which the second butterfly computation processing unit 22 outputs in the bit reverse order, in the order shown in FIG. 4 (hereinafter, called "arbitrary datasets sequential order"). The term of "arbitrary datasets sequential order" means an order in which the FFT device 10 outputs final results of the FFT process. The arbitrary datasets sequential order is an order at the time when "s" pieces of datasets Ps generated in the sequential order are outputted with the progress of cycles, and can be designated by an output order setting 52. In the present exemplary embodiment, the arbitrary datasets sequential order is designated in the order of P1, P8, P2, P7, P3, P6, P4, and P5.

The each line ps(i) in FIG. 4 represents the data to be inputted into the "i"-th data piece in the subsequent stage. Each of eight numerals included in each dataset is an identifier used for identifying any one of FFT points, and is specifically an index "k" in X(k).

The third data sorting processing unit 13 inputs a read address 51 outputted from the read address generation unit 41, and determines the output order of the data X(k).

The read address generation unit 41 generates the read address 51 to be outputted to the data sorting processing unit 13 referring to the output order setting 52 obtained from an upper level circuit (not shown) such as a central processing unit (CPU).

The data sorting processing units temporarily stores the inputted data and controls the select and the output of the stored data, by which the data sorting process is achieved according to each of the sequential order shown in FIG. 2, the bit reverse order shown in FIG. 3, and the arbitrary datasets sequential order shown in FIG. 4. Specific examples of the data sorting processing unit will be described below.

Figure 5:
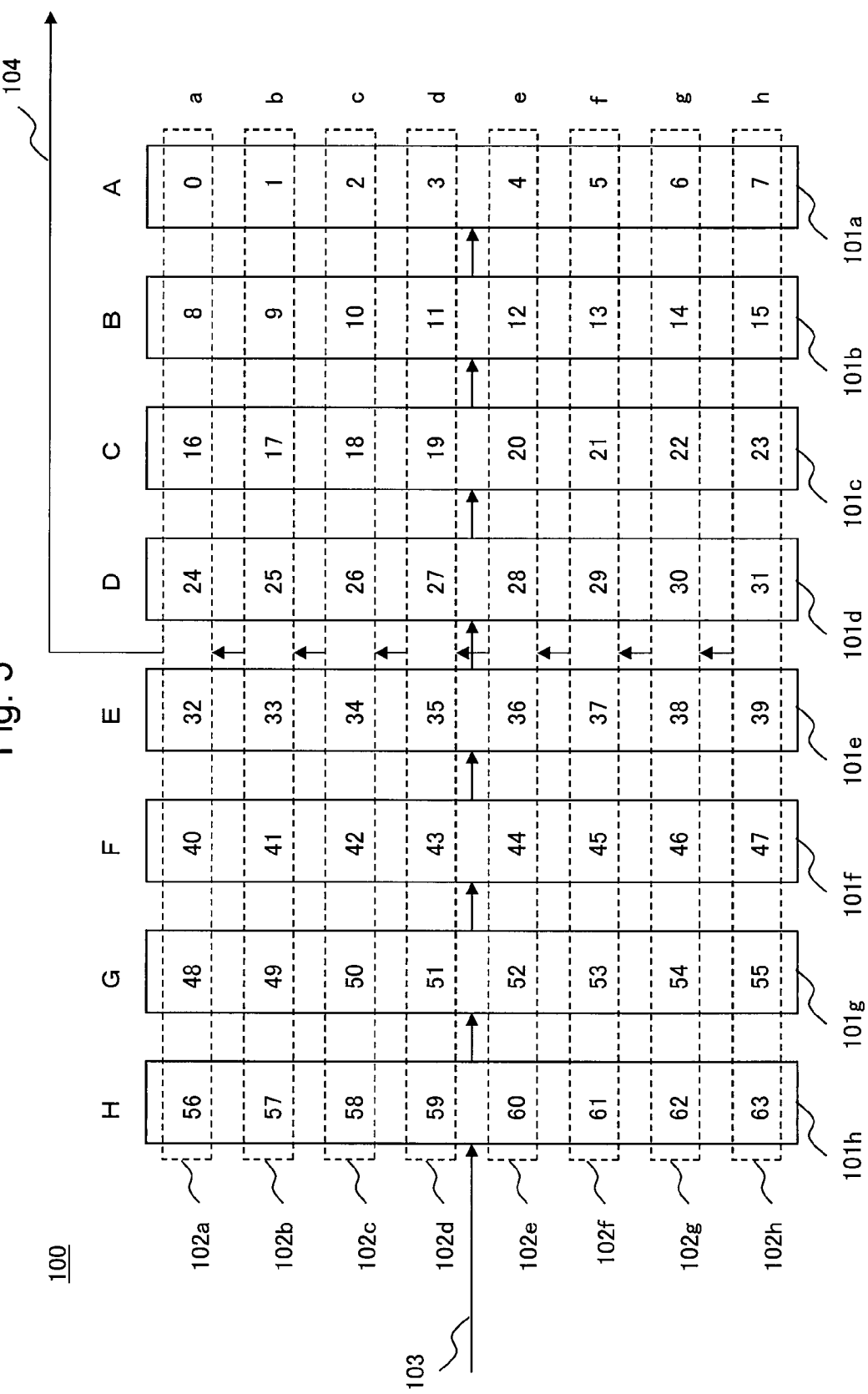
FIG. 5 is a block diagram illustrating an example configuration 100 for a first data sorting circuit 11 and a second data sorting processing circuit 12 in accordance with the first exemplary embodiment of the present invention.

The first data sorting processing unit 11 and the second data sorting processing unit 12 can be implemented by a data sorting processing unit 100 shown in FIG. 5, for example.

The data sorting processing unit 100 inputs datasets D1 to D8 composed of eight pieces of data inputted as input information 103 in the first-in order in an FIFO (first in first out) butter, writes them into data storage locations 101a to 101h, and stores them. Specifically, the datasets D1 to D8 are stored in the data storage locations 101a to 101h, respectively.

Next, the data sorting processing unit 100 outputs the stored data in the first-out order in the FIFO buffer. Specifically, the data sorting processing unit 100 reads eight pieces of data from respective data read locations 102a to 102h, making them a single dataset, and outputs eight datasets D1' to D8' as output information 104. Thus, the datasets D1' to D8' are made as a single set by rearranging, in the order of data location, the data included in the datasets D1 to D8 arranged in the order of cycle.

Figure 6:
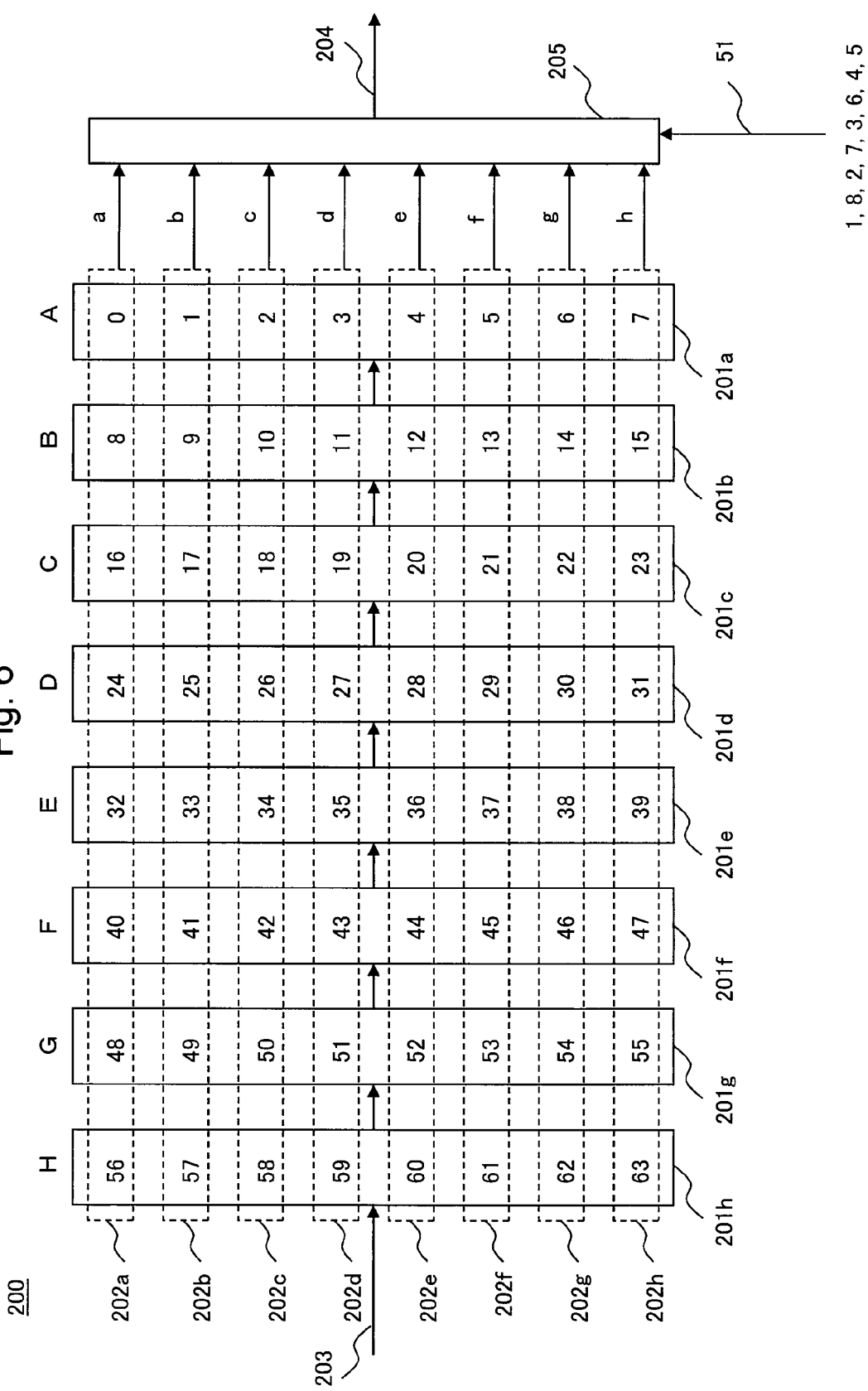
FIG. 6 is a block diagram illustrating an example configuration 200 for a third data sorting processing circuit 13 in accordance with the first exemplary embodiment of the present invention.

On the other hand, FIG. 6 illustrates a configuration of a data sorting processing unit 200 which is an example implementation of the third data sorting processing unit 13. The data sorting processing unit 200 inputs datasets P1 to P8 composed of eight pieces of data inputted as input information 203 in the first-in order in an FIFO butter, writes them into data storage locations 201a to 201h, and stores them. That is to say, the datasets D1 to D8 are stored in sequence in the respective data storage locations 201a to 201h corresponding to the order of cycle. When the stored data are viewed in the order of data location, that is, the order of data storage locations 202a to 202h, the datasets D1' to D8' are stored in the data storage locations 202a to 202h, respectively.

Next, the data sorting processing unit 200 reads the stored data through a reading circuit 205 and outputs them as output information 204. At this time, the reading circuit 205 selects any one of the data storage locations 202a to 202h referring to the read address 51, and reads any one of the eight pieces of data stored in the data storage locations 202a to 202h in a single reading operation. In this way, it is possible to read the data in no particular order by giving read addresses to the read address 51 in desired order which can be arbitrarily designated. For example, if the read address 51 is given read addresses in the order of 1, 8, 2, 7, 3, 6, 4, and 5, the data sorting processing unit 200 outputs the stored data in the order of the dataset D1', D8', D2', D7', D3', D6', D4', and D5'. That is to say, the data are outputted in the arbitrary datasets sequential order shown in FIG. 4. Here, the datasets D1' to D8' are made as a single set by rearranging, in the order of data location, the data included in the datasets D1 to D8 arranged in the order of cycle.

As described above, the sorting processes are performed three times according to each of the sequential order shown in FIG. 2, the bit reverse order shown in FIG. 3, and the arbitrary datasets sequential order shown in FIG. 4 by the first data sorting processing unit 11, the second data sorting processing unit 12, and the third data sorting processing unit 13 in the FFT device 10.

Since it is possible to output a plurality of data required for the subsequent process at a close timing by controlling each of the first data sorting processing unit 11, the second data sorting processing unit 12, and the third data sorting processing unit 13 as the above, there is no need to further sort the data. The data rearrangement in the third data sorting processing unit 13 will be described below as an example.

By using the FFT device 10 shown in FIG. 1, a 64-point FFT process in 8-data parallel will be described below as an example. The FFT 10 device inputs time-domain data x(n) (n=0, 1, . . . , 63) and generates and outputs frequency-domain signals X(k) (k=0, 1, . . . , 63) which have been Fourier-transformed through FFT processing. The input data x(n), 64 pieces of data in total, are inputted in the order shown in FIG. 2 with eight pieces of data during a period of eight cycles. In FIG. 2, only indexes "n" of x(n) are shown.

Specifically, at the first cycle, eight pieces of data of x(0), x(1), . . . , and x(7) composing a dataset P1 are inputted. Next, at the second cycle, eight pieces of data of x(8), x(9), . . . , and x(15) composing a dataset P2 are inputted. Similarly, at each cycle from third one to eighth one, the data composing a dataset from P3 to P8 are inputted respectively.

On the other hand, the output data X(k), 64 pieces of data in total, are outputted in the order shown in FIG. 4 with eight pieces of data during a period of eight cycles. In FIG. 4, only indexes "k" of X(k) are shown. Specifically, the following data are outputted in each cycle:

In the first cycle:
  Eight pieces of data X(0), X(1), . . . , X(7) composing a dataset D1 are outputted.
In the second cycle:
  Eight pieces of data X(56), X(57), . . . , X(63) composing a dataset D8 are outputted.
In the third cycle:
  Eight pieces of data X(8), X(9), . . . , X(15) composing a dataset D2 are outputted.
In the fourth cycle:
  Eight pieces of data X(48), X(49), . . . , X(55) composing a dataset D7 are outputted.
In the fifth cycle:
  Eight pieces of data X(16), X(17), . . . , X(23) composing a dataset D3 are outputted.
In the sixth cycle:
  Eight pieces of data X(40), X(41), . . . , X(47) composing a dataset D6 are outputted.
In the seventh cycle:
  Eight pieces of data X(24), X(25), . . . , X(31) composing a dataset D4 are outputted.
In the eighth cycle:
  Eight pieces of data X(32), X(33), . . . , X(39) composing a dataset D5 are outputted.

As mentioned above, two pieces of the output data X1(k1) and X2(k2), where the sum of the indexes k1 and k2 becomes equal to 63 corresponding to the number of FFT points, are always outputted in consecutive cycles. In other words, the FFT device 10 can output X(k) and X(N−k) (N=63) for any index "k" at a time lag within one cycle at most.

(Effects of the First Exemplary Embodiment)

As described above, in the present embodiment, the FFT device 10 can output the data in no particular order by designating the order using the output order setting 52.

For example, if a computation is performed between a plurality of output data X(k) (k=0, 1, . . . , N−1) with different "k" values in a stage following the FFT device 10, the FFT device 10 can output two pieces of data X(k) of input values for the computation at as close cycles as possible. If a computation is performed between X(k) and X(N−k), it is possible to output X(k) and X(N−k) at a time lag within one cycle at most. As a result, there is no need to add a circuit used for further sorting the output data.

In addition, the read address generation unit 41 alone is required as an additional circuit in order to designate the output order of the output data, and its circuit size is very small.

Accordingly, it is possible to suppress an increase in a circuit size as a whole and power consumption, including processes in following stages.

Although the FFT process is described as an example in the present exemplary embodiment, much the same is true on an IFFT process. That is to say, if the outputs order of processing results is optimized taking into account the processes in stages following the IFFT process by applying the control method in the present exemplary embodiment to an IFFT processing device, it is possible to speed up processes in stages following the IFFT process.

A Second Exemplary Embodiment

There is a case where the results of a process in a stage preceding FFT/IFFT processes are outputted in the order unique to the process and are inputted into an FFT/IFFT processing device, in contrast to the first exemplary embodiment. In this case, it is effective to rearrange the inputted processing results in the preceding stage in an order suitable for the FFT/IFFT process in order to speed up the FFT/IFFT processes and suppress an increase in the circuit size and the power consumption.

In the second exemplary embodiment, an IFFT device will be described which operates corresponding to an arbitrary datasets sequential order of an output order in the FFT device 10 at the preceding stage, which is shown in FIG. 4, for example.

Figure 7:
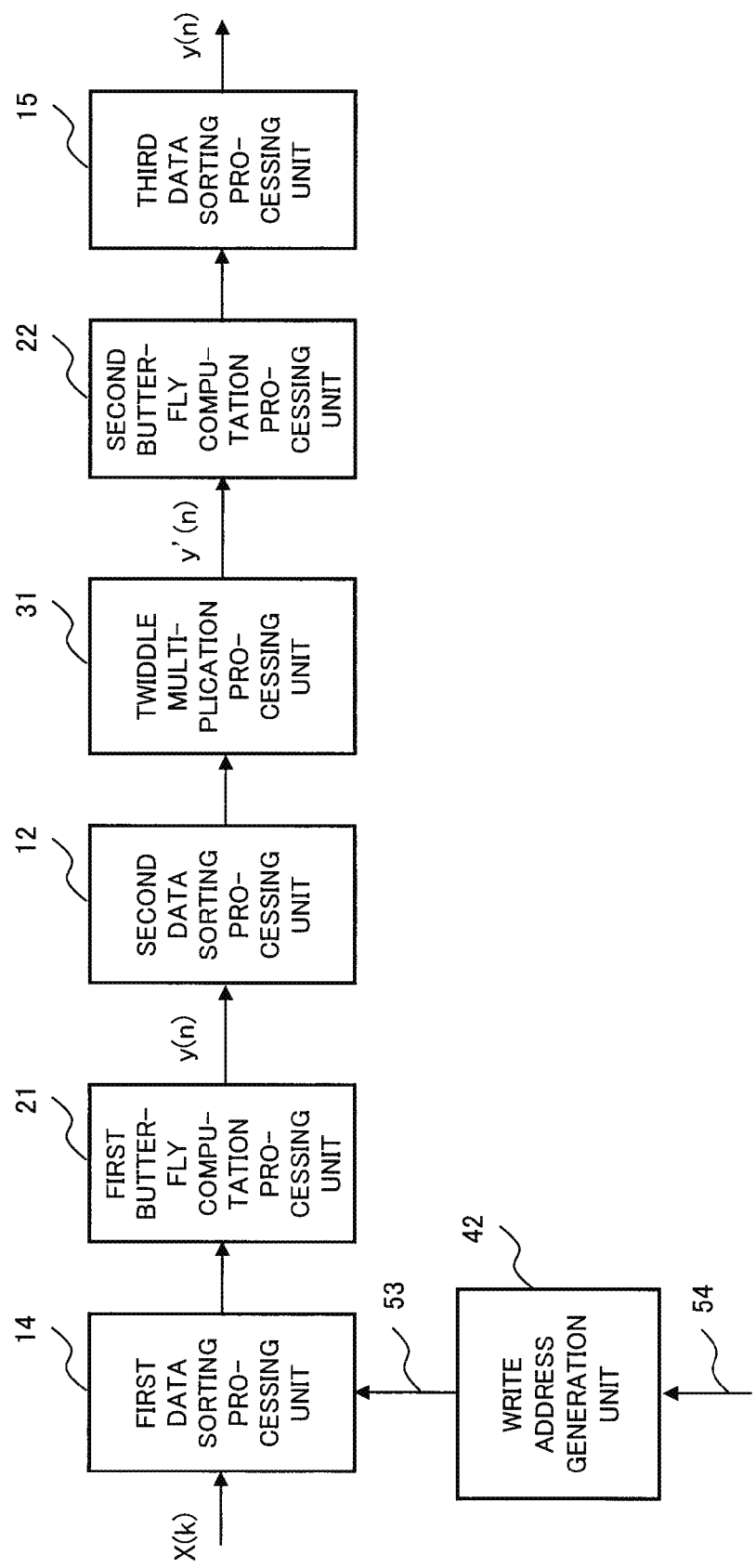
FIG. 7 is a block diagram illustrating a configuration of an IFFT device 20 in accordance with a second exemplary embodiment of the present invention.

FIG. 7 is a block diagram illustrating an example of a configuration of an IFFT device 20 in accordance with the second exemplary embodiment of the present invention. The IFFT device 20 processes a 64-point IFFT decomposed into two-stage radix-8 butterfly processes by a pipelined circuit system according to a dataflow similar to the dataflow 500 of the FFT shown in FIG. 19. The IFFT device 20 inputs frequency-domain signals X(k) (k=0, 1, . . . , N−1) which have been Fourier-transformed by the FFT device 10, generates time-domain data y(n) (n=0, 1, . . . , N−1) by performing an inverse Fourier-transformation on X(k), and outputs them. Here, N is a positive integer representing the IFFT block size.

In FIG. 7, the IFFT device 20 performs a 64-point IFFT process in 8-data parallel. The IFFT device 20 inputs the input data X(k) in the arbitrary datasets sequential order shown in FIG. 4 as is the case with the outputs of the FFT device 10. On the other hand, the IFFT device 20 outputs the output y(n) in the sequential order shown in FIG. 2.

The IFFT device 20 includes a first data sorting processing unit 14, a first butterfly computation processing unit 21, a second data sorting processing unit 12, a twiddle multiplication processing unit 31, a second butterfly computation processing unit 22, a third data sorting processing unit 15, and a write address generation unit 42. The IFFT device 20 performs pipeline processing on a first data sorting process, a first butterfly computation process, a second data sorting process, a twiddle multiplication process, a second butterfly computation process, and a third data sorting process.

The first data sorting processing unit 14 is a buffer circuit to rearrange data. That is to say, the first data sorting processing unit 14 rearranges a data sequence before the first butterfly computation processing unit 21 based on data dependency in the IFFT processing algorithm. In addition to the above data rearrangement, the first data sorting processing unit 14 also performs a data sorting processing to input data in an arbitrary datasets sequential order.

Specifically, the first data sorting processing unit 14 rearranges the arbitrary datasets sequential order shown in FIG. 4, that is, the input order of the input data X(k), into the bit reverse order shown in FIG. 3 which is the order to be inputted into the first butterfly computation processing unit 21.

The second data sorting processing unit 12 and the third data sorting processing unit 15 are also buffer circuits to rearrange data. The second data sorting processing unit 12 and the third data sorting processing unit 15 rearrange a data sequence, respectively, after the first butterfly computation processing unit 21 and the second butterfly computation processing circuit 22 based on data dependency in the IFFT processing algorithm.

The first butterfly computation processing unit 21 is a butterfly circuit which performs the first round of the butterfly computation process 502 (the first butterfly computation process) of the radix-8 butterfly computation processes performed two times in the dataflow 500 shown in FIG. 19. The first butterfly computation processing unit 21 outputs the results of the butterfly computation in the sequential order shown in FIG. 2 as data y(n) (n=0, 1, . . . , 63).

The second data sorting processing unit 12 rearranges the data y(n), which are outputted from the first butterfly computation processing unit 21 in the sequential order, in the bit reverse order as shown in FIG. 3 in order to be inputted into the twiddle multiplication processing unit 31.

The twiddle multiplication processing unit 31 is a circuit handling a complex rotation on the complex plane in the IFFT computation after the first butterfly computation, and corresponds to the twiddle multiplication process 504 in the dataflow 500 shown in FIG. 19. The data rearrangement is not performed in the twiddle multiplication process.

The second butterfly computation processing unit 22 is a butterfly circuit which performs the second round of the radix-8 butterfly process 503 in the dataflow 500 shown in FIG. 19. The second butterfly computation processing unit 22 performs the butterfly computation on the data y'(n) (n=0, 1, . . . , 63) to be inputted in the bit reverse order after the twiddle multiplication, and outputs the results X(k) (k=0, 1, . . . 63) in the same bit reverse order just the same.

The third data sorting processing unit 15 rearranges the data X(k), which the second butterfly computation processing unit 22 outputs in the bit reverse order, in the sequential order shown in FIG. 2. In other words, the IFFT device 20 outputs final results of the IFFT process in the sequential order.

The first data sorting processing unit 14 inputs a write address 53 outputted from the write address generation unit 42, and determines the input order of the data X(k).

The write address generation unit 42 generates the write address 53 to be outputted to the data sorting processing unit 14 referring to an input order setting 54 obtained from an upper level circuit (not shown) such as a CPU.

The second data sorting processing unit 12 and the third data sorting processing unit 15 can be implemented by a data sorting processing unit 100 shown in FIG. 5, for example.

Figure 8:
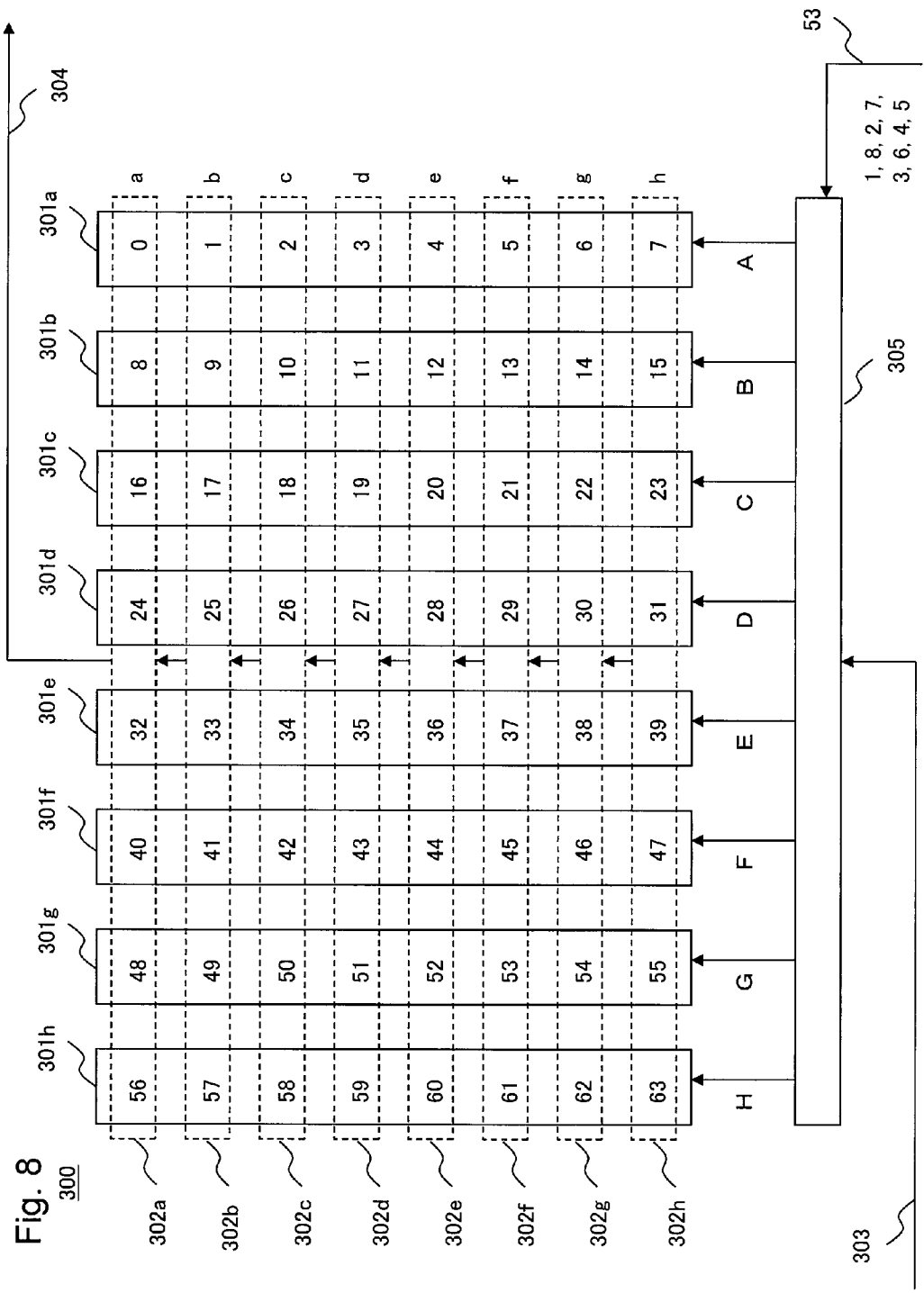
FIG. 8 is a block diagram illustrating an example configuration 300 for a first data sorting processing circuit 14 in accordance with the second exemplary embodiment of the present invention.

FIG. 8 illustrates a configuration of a data sorting processing unit 300 which is an example implementation of the first data sorting processing unit 14. The data sorting processing unit 300 writes datasets D1 to D8 composed of eight pieces of data to be inputted as input information 303 in the arbitrary datasets sequential order, into write locations 301a to 301h by means of a writing circuit 305. At this time, the writing circuit 305 selects any one of the write locations 301a to 301h referring to the write address 53, and performs a single writing operation. That is to say, it is possible to write the data in the desired order by giving write addresses to the write address 53 in the designated, predetermined order.

For example, if the write address 53 is given addresses in the order of 1, 8, 2, 7, 3, 6, 4, the data sorting processing unit 300 writes data inputted in the order of the datasets D1, D8, D2, D7, D3, D6, D4, and D5 into the write locations 301a to 301h in the order of D1, D2, D3, D4, D5, D6, D7, and D8, and stores them. That is to say, the datasets D1 to D8 are sequentially stored into the respective data storage locations 301a to 301h. When the stored data are viewed in the cycle order, that is, the order of the data storage locations 302a to 302h, the datasets D1' to D8' are stored in the data storage locations 302a to 302h, respectively.

Next, the data sorting processing unit 300 reads the stored data in the first-out order in an FIFO buffer, and outputs them. Specifically, the data sorting processing unit 300 reads the datasets D1' to D8' stored in the respective data storage locations 302a to 302h in the order of D1', D2', D3', D4', D5', D6', D7', and D8', and outputs them.

That is to say, the data sorting processing unit 300 corresponding to the first data sorting processing unit 14 can input data in no particular order by giving write addresses to the write address 53 in desired order which can be arbitrarily designated. For example, if the write address 53 is given addresses in the order of 1, 8, 2, 7, 3, 6, 4, and 5, the data sorting processing unit 300 inputs the data in the order of the dataset D1, D8, D2, D7, D3, D6, D4, and D5. That is to say, the data are inputted in the arbitrary datasets sequential order shown in FIG. 4, and stored.

On the other hand, the data sorting processing unit 100, which corresponds to the second data sorting processing unit 12 and the third data sorting processing unit 15, outputs the stored data in the order of D1, D2, D3, D4, D5, D6, D7, and D8, that is, in the sequential order shown in FIG. 1.

(Effects of the Second Exemplary Embodiment)

As described above, in the present embodiment, the IFFT device 20 can input the data in no particular order by designating the order using the input order setting 54. Accordingly, there is no need to provide an additional sorting means for the input in response to the output order of the FFT device 10.

In addition, the write address generation unit 42 alone is required as an additional circuit in order to be adapted to the input data inputted in an arbitrary order, and its circuit size is very small.

Accordingly, it is possible to suppress an increase in a circuit size as a whole and power consumption, including processes in preceding stages.

Although the IFFT process is described as an example in the present exemplary embodiment, much the same is true on an FFT process. That is to say, if the input order of input signals is optimized taking into account the processes in stages preceding the FFT process by applying the control method in the present exemplary embodiment to an FFT processing device, it is possible to speed up the FFT process.

A Third Exemplary Embodiment

It is possible to omit the third data sorting processing unit 13 in the FFT device 10 by modifying the second data sorting processing unit 12. A configuration of an FFT device 30, in which the third data sorting processing unit 13 is removed from the FFT device 10, will be described with reference to FIG. 9.

Figure 9:
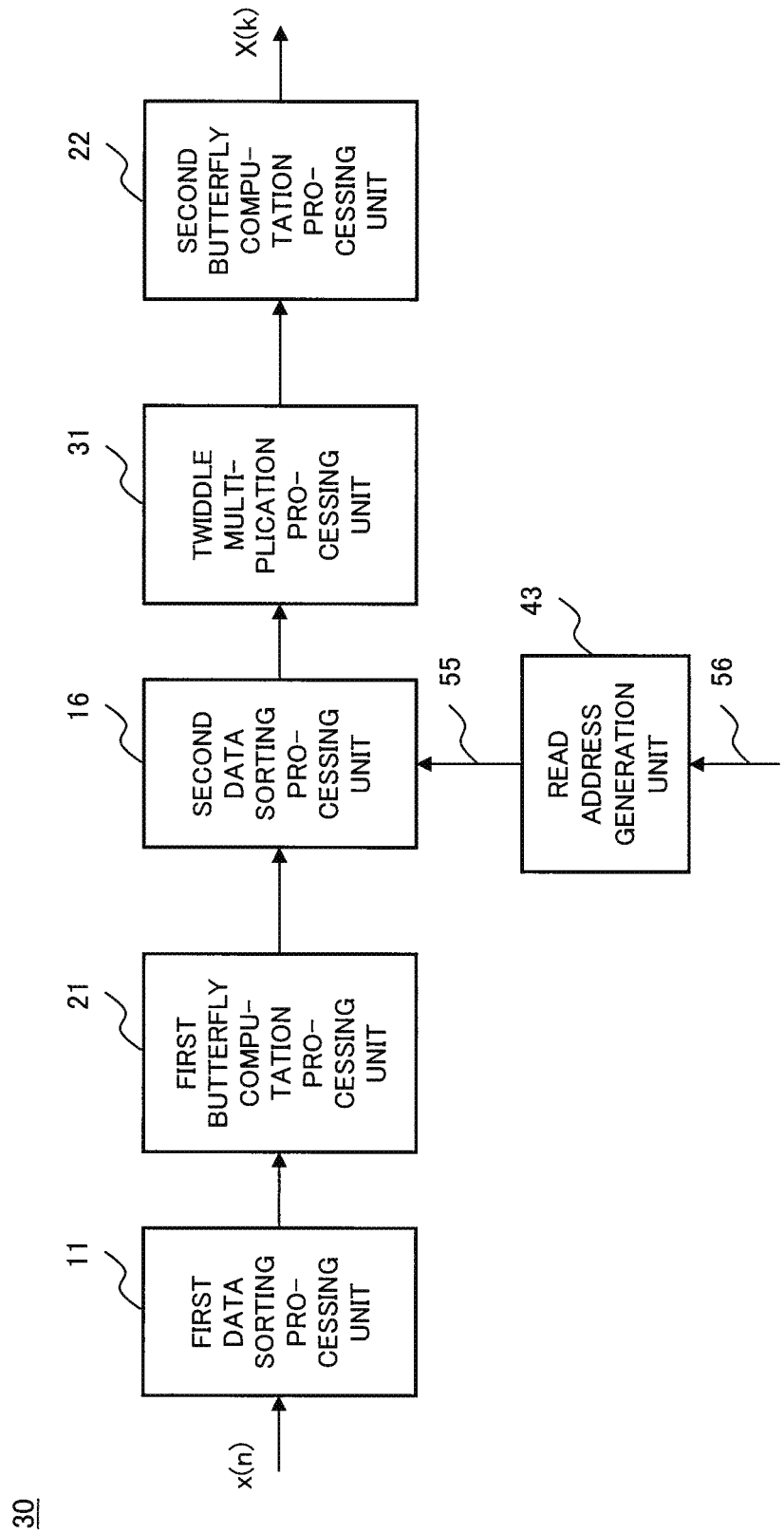
FIG. 9 is a block diagram illustrating a configuration of an FFT device 30 in accordance with a third exemplary embodiment of the present invention.

FIG. 9 is a block diagram illustrating an example of a configuration of the FFT device 30 in accordance with a third exemplary embodiment of the present invention. The FFT device 30 processes a 64-point FFT decomposed into two-stage radix-8 butterfly processes by a pipelined circuit system according to a dataflow similar to the FFT dataflow shown in FIG. 19. The FFT device 30 inputs time-domain data x(n) (n=0, 1, . . . , N−1), performs an Fourier-transformation through an FFT process on x(n), and generates and outputs frequency-domain signals X(k) (k=0, 1, . . . , N−1). Here, N is a positive integer representing the FFT block size.

By using the FFT device 30 shown in FIG. 9, a 64-point FFT process in 8-data parallel will be described as an example. The FFT device 30 inputs time-domain data x(n) (n=0, 1, . . . , 63) and generates and outputs frequency-domain signals X(k) (k=0, 1, . . . , 63) which have been Fourier-transformed through FFT processing. The input data x(n), 64 pieces of data in total, are inputted in the order shown in FIG. 2 with eight pieces of data during a period of eight cycles.

On the other hand, the output data X(k), 64 pieces of data in total, are outputted in the order shown in FIG. 10, for example (hereinafter, called "arbitrary datasets bit reverse order") with eight pieces of data during a period of eight cycles.

The each line qs(i) in FIG. 10 represents the data to be inputted into the "i"-th data in the subsequent stage. Each of eight numerals included in each dataset is an identifier used for identifying any one of FFT points, and is specifically an index "k" in x(k).

Specifically, the following data pieces are outputted in each cycle:

In the first cycle:
  Eight pieces of data X(0), X(8), . . . , X(56) composing a dataset Q1 are outputted.
In the second cycle:
  Eight pieces of data X(7), X(15), . . . , X(63) composing a dataset Q8 are outputted.
In the third cycle:
  Eight pieces of data X(1), X(9), . . . , X(57) composing a dataset Q2 are outputted.
In the fourth cycle:
  Eight pieces of data X(6), X(14), . . . , X(62) composing a dataset Q7 are outputted.
In the fifth cycle:
  Eight pieces of data X(2), X(10), . . . , X(58) composing a dataset Q3 are outputted.
In the sixth cycle:
  Eight pieces of data X(5), X(13), . . . , X(61) composing a dataset Q6 are outputted.
In the seventh cycle:
  Eight pieces of data X(3), X(11), . . . , X(59) composing a dataset Q4 are outputted.
In the eighth cycle:
  Eight pieces of data X(4), X(12), . . . , X(60) composing a dataset Q5 are outputted.

As mentioned above, two pieces of the output data X1(k1) and X2(k2), where the sum of the indexes k1 and k2 becomes equal to 63 corresponding to the number of FFT points, are always outputted in consecutive cycles. In other words, the FFT device 30 can output X(k) and X(N−k) (N=63) for any index "k" at a time lag within one cycle at most, as is the case with the FFT device 30.

The FFT device 30 includes a first data sorting processing unit 11, a first butterfly computation processing unit 21, a second data sorting processing unit 16, a twiddle multiplication processing unit 31, a second butterfly computation processing unit 22, and a read address generation unit 43. In the FFT device 30, the same components as those in the FFT device 10 are given the same reference numbers, and their detail descriptions are omitted. The FFT device 30 performs pipeline processing on a first data sorting process, a first butterfly computation process, a second data sorting process, a twiddle multiplication process, and a second butterfly computation process.

The FFT device 30 has a configuration in which the third data sorting processing unit 13 is removed from the configuration of the FFT device 10. The second data sorting processing unit 16 in the FFT device 30 performs the data rearrangement which the third data sorting processing unit 13 in the FFT device 10 performs referring to the read address 51. That is to say, the second data sorting processing unit 16 inputs the read address 55 and rearranges a data sequence based on data dependency in the FFT processing algorithm. In addition to the above data rearrangement, the second data sorting processing unit 16 performs a data rearrangement to output X(k) and X(N−k) at a time lag within one cycle at most for any k in the output X(k) of the FFT device 30.

Specifically, the second data sorting processing unit 16 rearranges the data which the first butterfly computation processing unit 21 outputs in the sequential order shown in FIG. 2, into the arbitrary datasets bit reverse order shown in FIG. 10 which is the order to be inputted into the twiddle multiplication processing unit 31.

The second data sorting processing unit 16 can be implemented in a configuration similar to that of the data sorting processing unit 200 shown in FIG. 6.

Since the twiddle multiplication processing 31 and the second butterfly computation processing 22 do not change the order between datasets, the second butterfly computation processing unit 22 outputs the results X(k) of the FFT process in the arbitrary datasets bit reverse order shown in FIG. 10.

(Effects of the Third Exemplary Embodiment)

As described above, in the present embodiment, the FFT device 30 can output the data in no particular order by designating the order using the output order setting 56.

For example, if a computation is performed between a plurality of output data X(k) (k=0, 1, . . . , N−1) with different "k" values in a stage following the FFT device 30, the FFT device 30 can output X(k) of input values for the computation at as close cycles as possible. If a computation is performed between X(k) and X(N−k), it is possible to output X(k) and X(N−k) at a time lag within one cycle at most. As a result, there is no need to add a circuit used for further sorting the output data.

In addition, the read address generation unit 43 alone is required as an additional circuit in order to designate the output order of the output data, and its circuit size is very small.

Accordingly, it is possible to suppress an increase in a circuit size as a whole and power consumption, including processes in following stages.

In addition, the third data sorting processing unit 13 can be omitted compared with the FFT device 10. As a result, a circuit size and power consumption can be reduced further.

Although the FFT process is described as an example in the present exemplary embodiment, much the same is true on an IFFT process. That is to say, if the outputs order of processing results is optimized taking into account the processes in stages following the IFFT process by applying the control method in the present exemplary embodiment to an IFFT processing device, it is possible to speed up processes in stages following the IFFT process.

A Fourth Exemplary Embodiment

An IFFT device will be described which operates corresponding to an arbitrary datasets bit reverse order of an output order in the FFT device 30.

Figure 11:
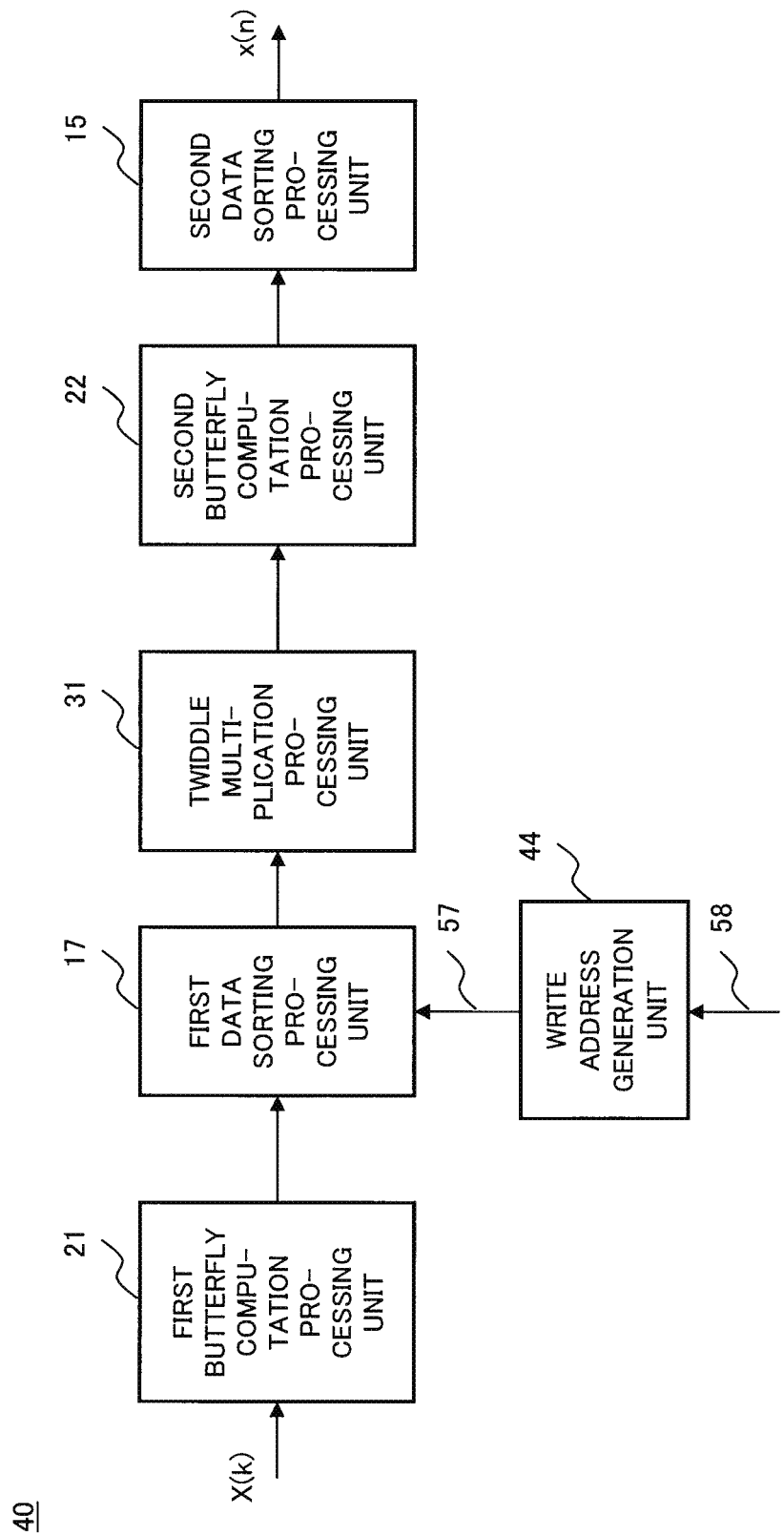
FIG. 11 is a block diagram illustrating a configuration of an IFFT device 40 in accordance with a fourth exemplary embodiment of the present invention.

FIG. 11 is a block diagram illustrating an example of a configuration of an IFFT device 40 in accordance with the fourth exemplary embodiment of the present invention. The IFFT device 40 processes a 64-point IFFT decomposed into two-stage radix-8 butterfly processes by a pipelined circuit system according to a dataflow similar to the FFT dataflow shown in FIG. 19. The IFFT device 40 inputs frequency-domain signals X(k) (k=0, 1, . . . , N−1) which have been Fourier-transformed by the FFT device 30, generates time-domain data y(n) (n=0, 1, . . . , N−1) by performing an inverse Fourier-transformation on X(k), and outputs them. Here, N is a positive integer representing the IFFT block size.

In FIG. 11, the IFFT device 40 performs a 64-point IFFT process in 8-data parallel. The IFFT device 40 inputs the input data X(k) in the arbitrary datasets bit reverse order shown in FIG. 10 as is the case with the output of the FFT device 30. On the other hand, the IFFT device 40 outputs the output y(n) in the sequential order shown in FIG. 2.

The IFFT device 40 includes a first butterfly computation processing unit 21, a first data sorting processing unit 17, a twiddle multiplication processing unit 31, a second butterfly computation processing unit 22, a second data sorting processing unit 15, and a write address generation unit 44. In the IFFT device 40, the same components as those in the IFFT device 20 are given the same reference numbers, and their detail descriptions are omitted. The IFFT device 40 performs pipeline processing on a first butterfly computation process, a first data sorting process, a twiddle multiplication process, a second butterfly computation process, and a second data sorting process.

The IFFT device 40 has a configuration in which the first data sorting processing unit 14 is removed from the configuration of the IFFT device 20. The second data sorting processing unit 17 in the IFFT device 40 performs the data rearrangement which the first data sorting processing unit 14 in the IFFT device 20 performs referring to the write address 53. That is to say, the second data sorting processing unit 17 inputs the write address 57 and rearranges a data sequence based on data dependency in the IFFT processing algorithm. In addition to the above data rearrangement, the second data sorting processing unit 17 performs a data rearrangement to input data in the arbitrary datasets sequential order.

Specifically, the second data sorting processing unit 17 rearranges the data which the first butterfly computation processing unit 21 outputs in the arbitrary datasets sequential order shown in FIG. 4, into the bit reverse order shown in FIG. 3 which is the order to be inputted into the second butterfly computation processing unit 22.

The second data sorting processing unit 17 can be implemented in a configuration similar to that of the data sorting processing unit 300 shown in FIG. 8.

(Effects of the Fourth Exemplary Embodiment)

As described above, in the present embodiment, the IFFT device 40 can input the data in no particular order by designating the order using the input order setting 58. Accordingly, there is no need to provide an additional sorting means for the input in response to the output order of the FFT device 30.

In addition, the write address generation unit 44 alone is required as an additional circuit in order to be adapted to the input data inputted in an arbitrary order, and its circuit size is very small.

Accordingly, it is possible to suppress an increase in a circuit size as a whole and power consumption, including processes in preceding stages.

In addition, the first data sorting processing unit 14 can be omitted compared with the IFFT device 20. As a result, a circuit size and power consumption can be reduced further.

Although the IFFT process is described as an example in the present exemplary embodiment, much the same is true on an FFT process. That is to say, if the input order of input signals is optimized taking into account the processes in stages preceding the FFT process by applying the control method in the present exemplary embodiment to an FFT processing device, it is possible to speed up the FFT process.

As is clear from the above description, the feature of the fast Fourier transform device in accordance with the present invention is that it is possible to rearrange the data in no particular order before or after the transformation by the FFT/IFFT. This makes it possible to speed up the processing after the data rearrangement. If the FFT/IFFT is performed divided into multilevel processes, the data rearrangement can be performed between a process at one stage and another process at the next stage.

Figure 12:
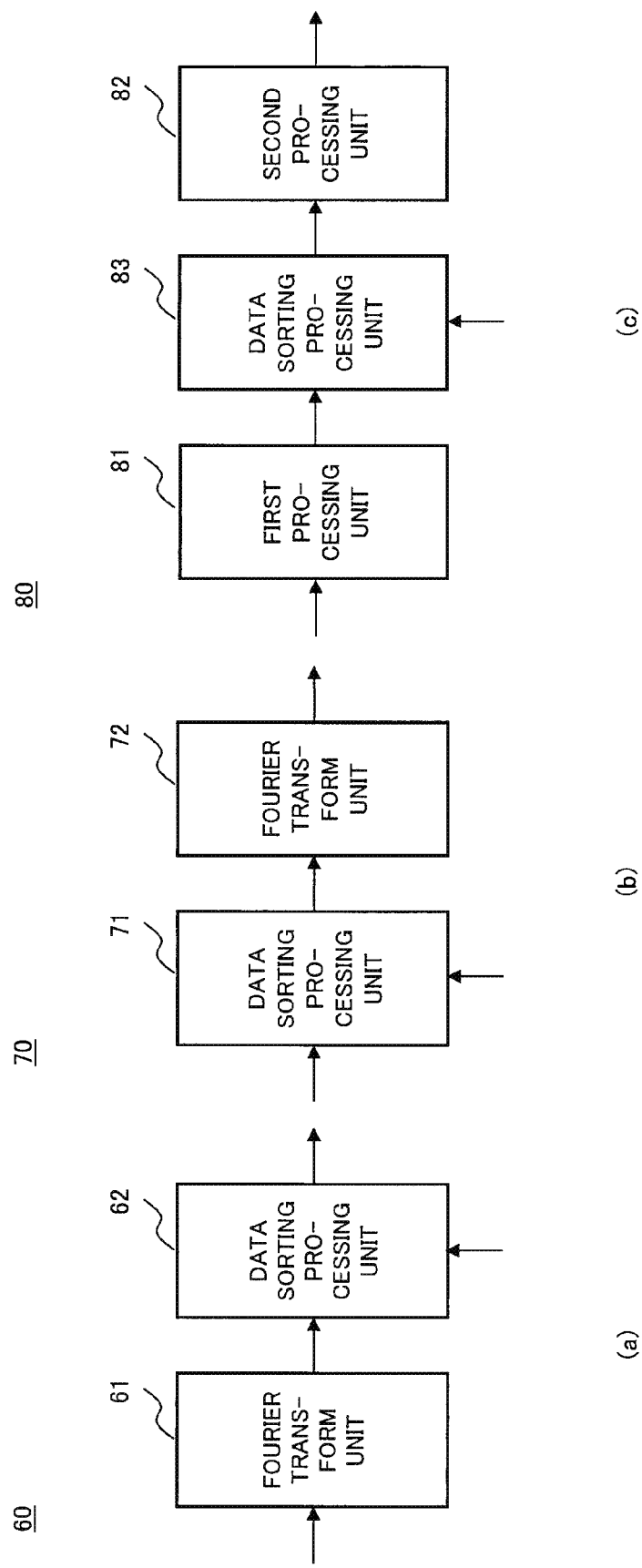
FIG. 12 is a block diagram illustrating required configurations of a fast Fourier transform device in accordance with the present invention.

FIGS. 12A, 12B, and 12C are block diagrams illustrating required configurations included in a fast Fourier transform device in accordance with the present invention.

The fast Fourier transform device 60 includes a Fourier transform unit 61 and a data sorting processing unit 62. The Fourier transform unit 61 performs a fast Fourier transform or an inverse fast Fourier transform, generates a plurality of output data, and outputs them in a first order. The data sorting processing unit 62 rearranges the plurality of the first output data outputted in the first order, in a second order based on an output order setting. In this way, the fast Fourier transform device 60 rearranges data after the Fourier transform.

The fast Fourier transform device 70 includes a Fourier transform unit 72 and a data sorting processing unit 71. The data sorting processing unit 71 rearranges a plurality of input data inputted in a third order, in a fourth order based on an input order setting. The Fourier transform unit 72 performs a fast Fourier transform or an inverse fast Fourier transform on the plurality of the input data rearranged in the fourth order. In this way, the fast Fourier transform device 70 rearranges data before the Fourier transform.

The fast Fourier transform device 80 includes processing units 81, 82 and a data sorting processing unit 83. The fast Fourier transform device 80 performs a fast Fourier transform or an inverse fast Fourier transform divided into two stages by using the processing units 81 and 82. The processing unit 81 generates a plurality of intermediate data and outputs them in a fifth order. The data sorting processing unit 83 rearranges the plurality of the intermediate data inputted in the fifth order, in a sixth order based on an order setting. The processing unit 82 performs a predetermined process on the plurality of the intermediate data rearranged in the sixth order and generates output data of the results of the fast Fourier transform or the inverse fast Fourier transform. In this way, the fast Fourier transform device 80 rearranges the data in the middle stage of the fast Fourier transform process or the inverse fast Fourier transform process.

A Fifth Exemplary Embodiment

Figure 13:
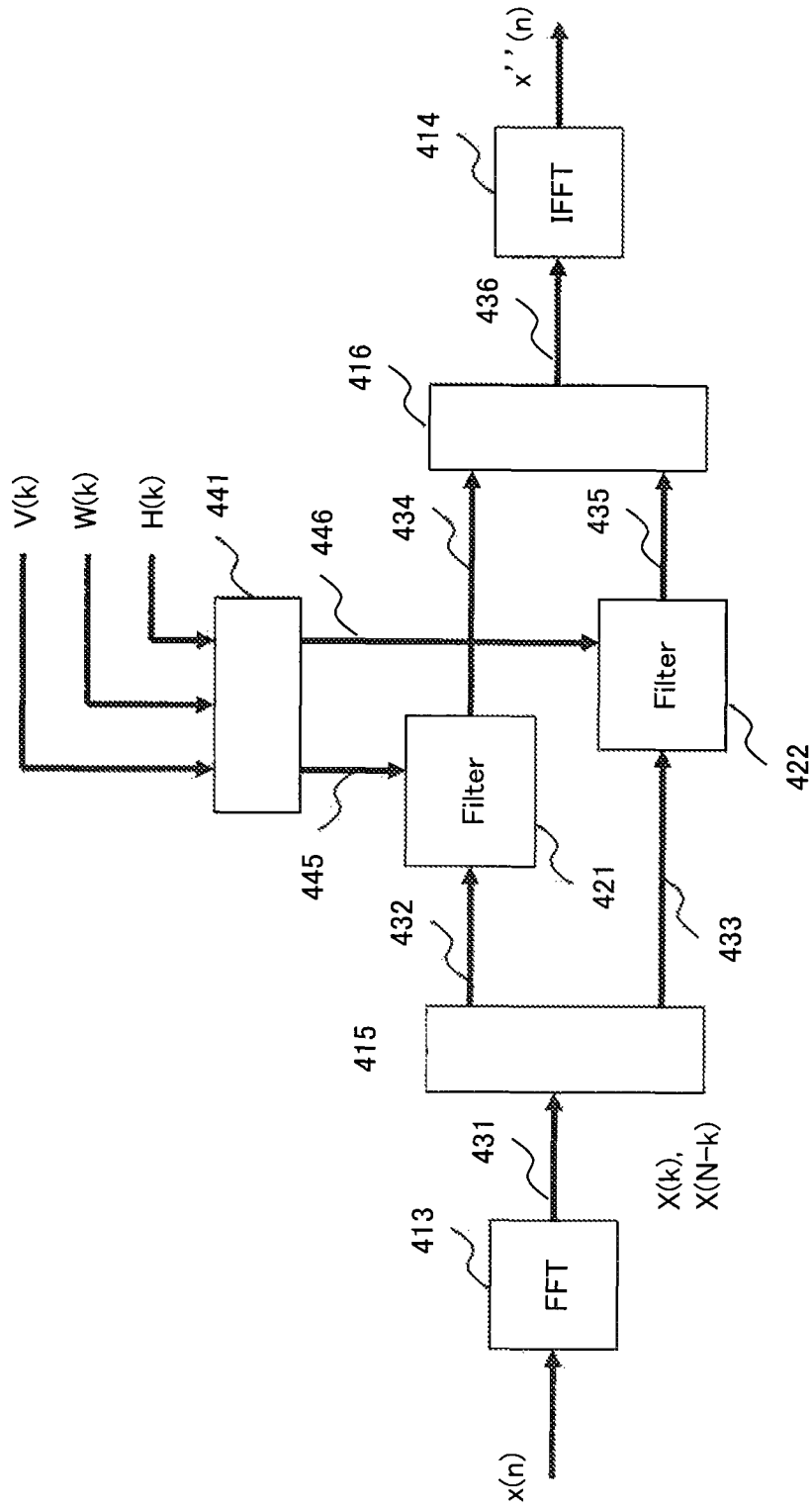
FIG. 13 is a block diagram illustrating an example configuration 400 of a digital filter circuit in accordance with a fifth exemplary embodiment of the present invention.

FIG. 13 is a block diagram illustrating a configuration of a digital filter circuit 400 in accordance with the fifth exemplary embodiment of the present invention. The digital filter circuit 400 includes an FFT circuit 413, an IFFT circuit 414, a complex conjugate generation circuit 415, a complex conjugate synthesis circuit 416, a filter circuit 421, a filter circuit 422, and a filter coefficient generation circuit 441.

The digital filter circuit 400 inputs a time-domain complex signal:

$$x(n)=r(n)+js(n) \quad (1)$$

The FFT circuit 413 transforms the inputted complex signal x(n) into a frequency-domain complex signal 431 through an FFT:

$$X(k)=A(k)+jB(k) \quad (2)$$

Here, n is an integer satisfying $0 \leq n \leq N-1$ representing a signal sample number in the time domain, N is an integer satisfying $0<N$ representing the number of FFT transformation samples, and k is an integer satisfying $0 \leq k \leq N-1$ representing a frequency number in the frequency domain.

The FFT circuit 413 generates the following from X(k) and outputs it:

$$X(N-k)=A(N-k)+jB(N-k) \quad (3)$$

For each frequency number k satisfying $0 \leq k \leq N-1$, the complex conjugate generation circuit 415 inputs X(N-k) outputted from the FFT circuit 413 and generates a complex conjugate of X(N-k):

$$X^*(N-k)=A(N-k)-jB(N-k) \quad (4)$$

The complex conjugate generation circuit 415 outputs the inputted complex signal X(k) as a complex signal 432, and outputs the generated complex signal X*(N-k) as a complex signal 433.

Next, from inputted complex coefficients V(k), W(k), and H(k), the filter coefficient generation circuit 441 generates, for each frequency number k satisfying $0 \leq k \leq N-1$, a complex coefficient:

$$C1(k)=\{V(k)+W(k)\} \times H(k) \quad (5)$$

and a complex coefficient:

$$C2(k)=\{V(k)-W(k)\} \times H(k) \quad (6)$$

Here, the complex coefficients V(k), W(k), and H(k) are frequency-domain coefficients given from an upper level circuit (not shown) of the digital filter circuit 400 and correspond to real filter coefficients with which a filtering process is performed through real number computations in the time domain. The V(k), W(k), and H(k) will hereinafter be described in detail.

The filter coefficient generation circuit 441 outputs the generated complex coefficient C1(k) as a complex signal 445. The filter coefficient generation circuit 441 generates a complex signal C2(N−k) from the complex signal C2(k) (formula (6)) and outputs it as a complex signal 446.

Next, the filter circuit 421 performs complex filtering processes through a complex multiplication on X(k) (formula (2)) which the complex conjugate generation circuit 415 outputs as the complex signal 432 using C1(k) (formula (5)) which the filter coefficient generation circuit 441 outputs as the complex signal 445. Specifically, the filter circuit 421 calculates the following complex signal:

$$X'(k)=X(k)\times C1(k) \tag{7}$$

for each frequency number k satisfying 0≤k≤N−1, and outputs it as a complex signal 434.

Similarly, the filter circuit 422 performs complex filtering processes through a complex multiplication on X*(N−k) (formula (4)) which the complex conjugate generation circuit 415 outputs as the complex signal 433 using C2(N−k) (formula (6)) which the filter coefficient generation circuit 441 outputs as the complex signal 446. Specifically, the filter circuit 422 calculates the following complex signal:

$$X^{*'}(N-k)=X^*(N-k)\times C2(N-k) \tag{8}$$

for each frequency number k satisfying 0≤k≤N−1, and outputs it as a complex signal 435.

Each of C1(k) and C2(k) can be expressed separated into a real part and an imaginary part as follows:

$$C1(k)=C1I(k)+jC1Q(k) \tag{9}$$

$$C2(k)=C2I(k)+jC2Q(k) \tag{10}$$

Next, the complex conjugate synthesis circuit 416 generates a complex signal X″(k) which is obtained by synthesizing X′(k) (formula (7)) and X*′(N−k) (formula (8)), where X′(k) is outputted from the filter circuit 421 as the complex signal 434 and X*′(N−k) is outputted from the filter circuit 422 as the complex signal 435. Specifically, the complex conjugate synthesis circuit 416 calculates:

$$X''(k)=1/2\times\{X'(k)+X^{*'}(N-k)\} \tag{11}$$

for each frequency number k satisfying 0≤k≤N−1, and outputs it as a complex signal 436.

Then, the IFFT circuit 414 generates and outputs a time-domain complex signal x″(n) through the IFFT for each frequency number k satisfying 0≤k≤N−1 from X″(k) (formula (11)) which the complex conjugate synthesis circuit 416 outputs as the complex signal 436.

It is possible to use the FFT circuit 10 in accordance with the first exemplary embodiment of the present invention as a method to implement the FFT circuit 413. Likewise, it is also possible to use the IFFT circuit 20 in accordance with the second exemplary embodiment of the present invention as a method to implement the IFFT circuit 414.

Alternatively, it is possible to use the FFT circuit 20 in accordance with the third exemplary embodiment of the present invention as a method to implement the FFT circuit 413. Likewise, it is possible to use the IFFT circuit 40 in accordance with the fourth exemplary embodiment of the present invention as a method to implement the IFFT circuit 414.

Figure 14:
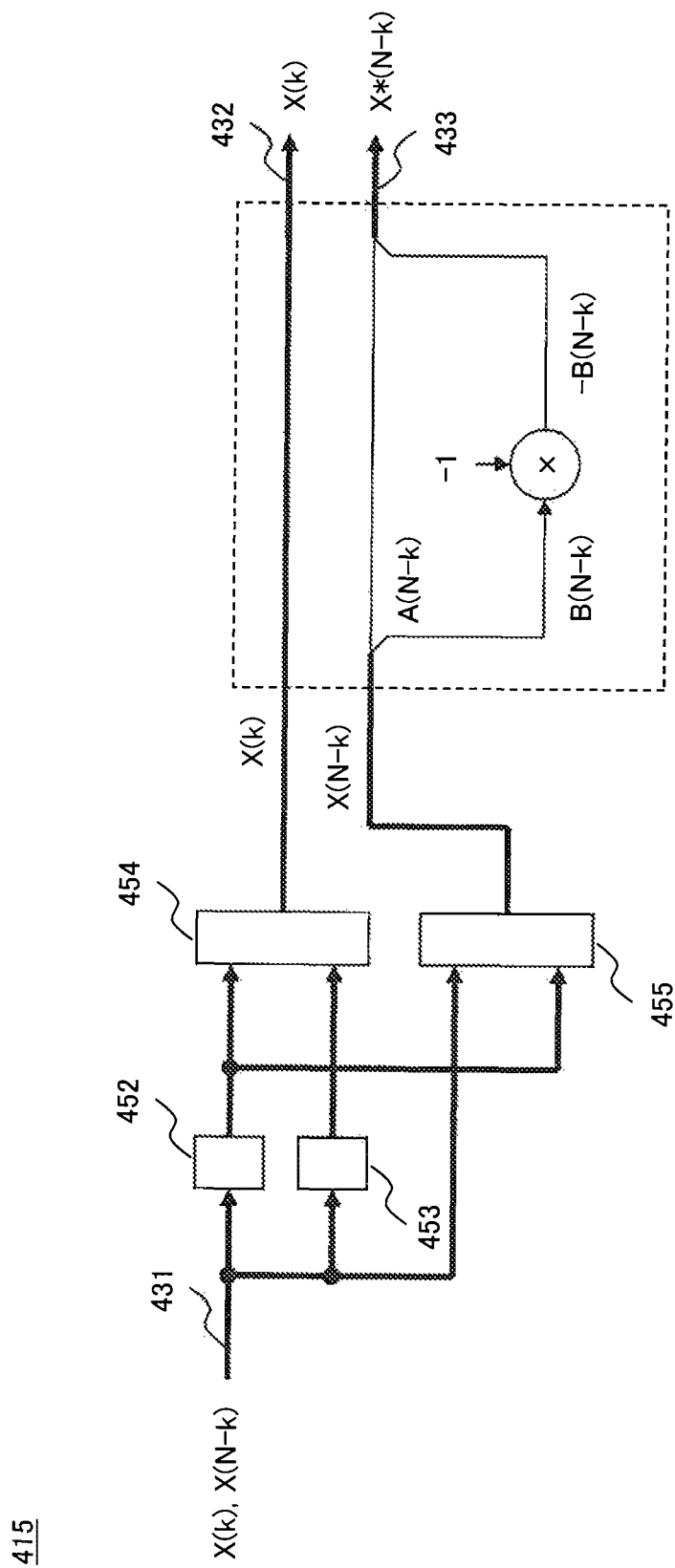
FIG. 14 is a block diagram illustrating a configuration of a complex conjugate generation circuit 415 in accordance with the fifth exemplary embodiment of the present invention.

FIG. 14 is a block diagram illustrating a detail configuration of the complex conjugate generation circuit 415. The complex conjugate generation circuit 415 includes data storage units 452, 453 and data selection units 454, 455.

The complex conjugate generation circuit 415 inputs X(k) (=A(k)+jB(k)); formula (2)) included in the output of the FFT circuit 413, and outputs it without any change. In addition, the complex conjugate generation circuit 415 inputs X(N−k) (=A(N−k)+jB(N−k)); formula (3)) included in the output of the FFT circuit 413, and calculates and outputs the following:

$$X^*(N-k)=A(N-k)-jB(N-k) \tag{4}$$

Each of X(k) and X*(N−k) can be expressed separated into a real part and an imaginary part as follows:

$$X(k)=XI(k)+jXQ(k) \tag{12}$$

$$X^*(N-k)=X^*I(N-k)+jX^*Q(N-k) \tag{13}$$

Figure 15:
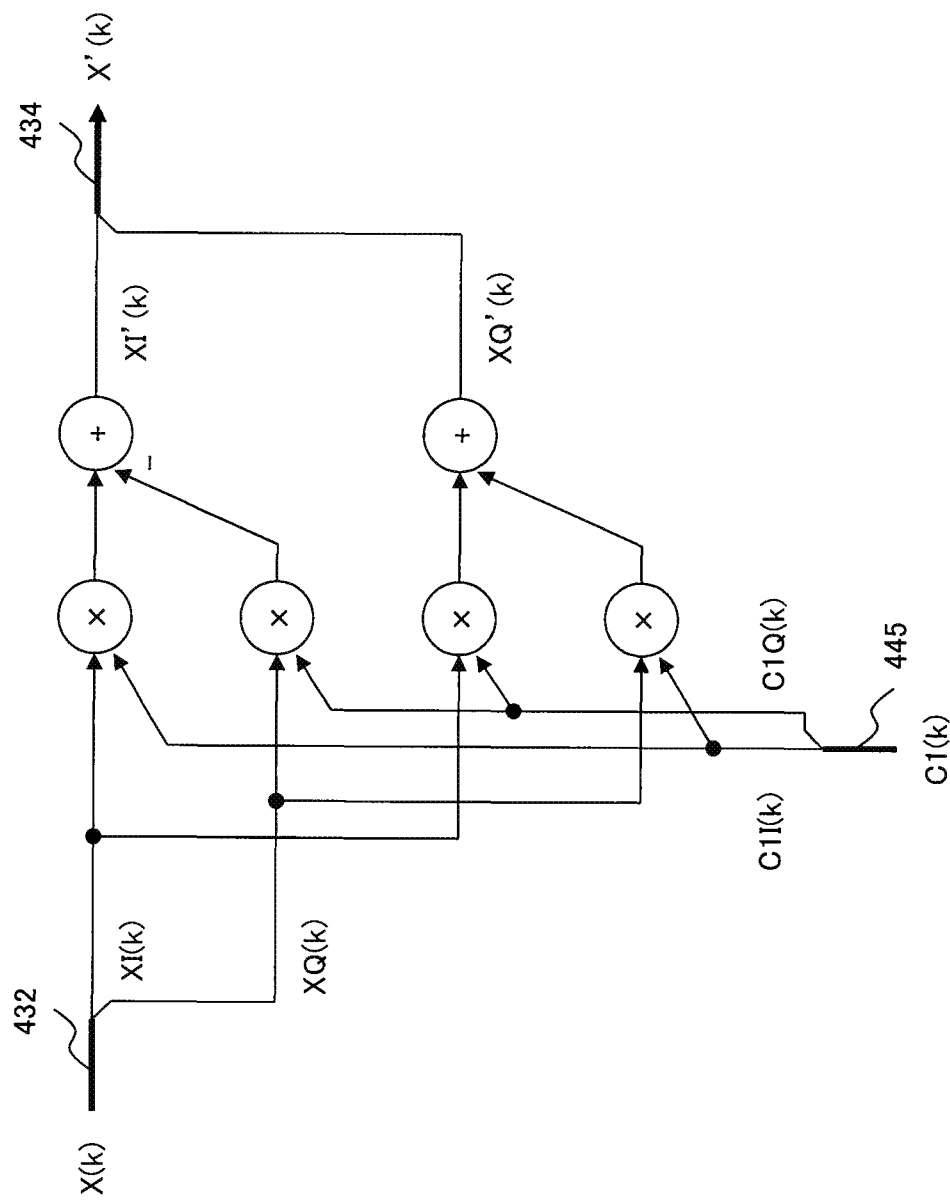
FIG. 15 is a block diagram illustrating a configuration of a filter circuit 421 in accordance with the fifth exemplary embodiment of the present invention.

FIG. 15 is a block diagram illustrating a detail configuration of the filter circuit 421. The filter circuit 421 inputs X(k) (=XI(k)+jXQ(k); formula (12)) which the complex conjugate generation circuit 415 outputs to the complex signal line 432 and the complex coefficient C1(k) (=C1I(k)+jC1Q(k); formula (9)), and calculates and outputs the following:

$$\begin{aligned}X'(k) &= XI'(k) + jXQ'(k) \\ &= X(k)\times C1(k)\end{aligned} \tag{14}$$

Here, XI′(k) and XQ′(k) are a real part and an imaginary part of X′(k), respectively, which are given by the following equations:

$$XI'(k)=XI(k)\times C1I(k)-XQ(k)\times C1Q(k) \tag{15}$$

$$XQ'(k)=XI(k)\times C1Q(k)+XQ(k)\times C1I(k) \tag{16}$$

Figure 16:
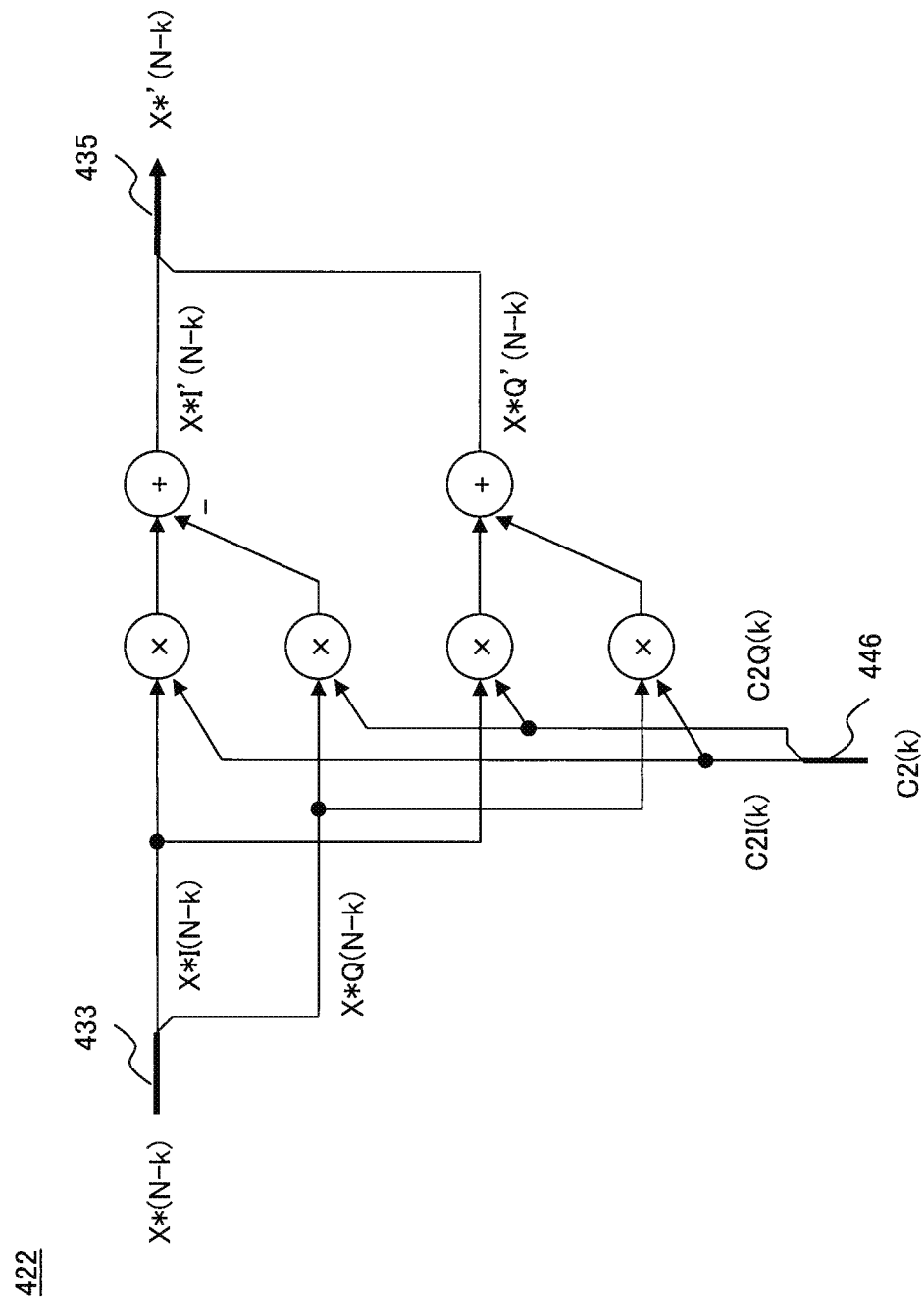
FIG. 16 is a block diagram illustrating a configuration of a filter circuit 422 in accordance with the fifth exemplary embodiment of the present invention.

FIG. 16 is a block diagram illustrating a detail configuration of the filter circuit 422. The filter circuit 422 inputs X*(N−k) (=X*I(N−k)+jX*Q(N−k); formula (13)) which the complex conjugate generation circuit 415 outputs to the complex signal line 433 and the complex coefficient C2(k) (=C2I(k)+jC2Q(k); formula (10)), and calculates and outputs the following:

$$\begin{aligned}X^{*'}(N-k) &= X^*I'(N-k) + jX^*Q'(N-k) \\ &= X^*(N-k)\times C2(N-k)\end{aligned} \tag{17}$$

Here, X*I′(N−k) and X*Q′(N−k) are a real part and an imaginary part of X*′(N−k), respectively, which are given by the following equations:

$$X^*I'(N-k)=X^*I(N-k)\times C2I(N-k)-X^*Q(N-k)\times C2Q(N-k) \tag{18}$$

$$X^*Q'(N-k)=X^*I(N-k)\times C2Q(N-k)+X^*Q(N-k)\times C2I(N-k) \tag{19}$$

Figure 17:
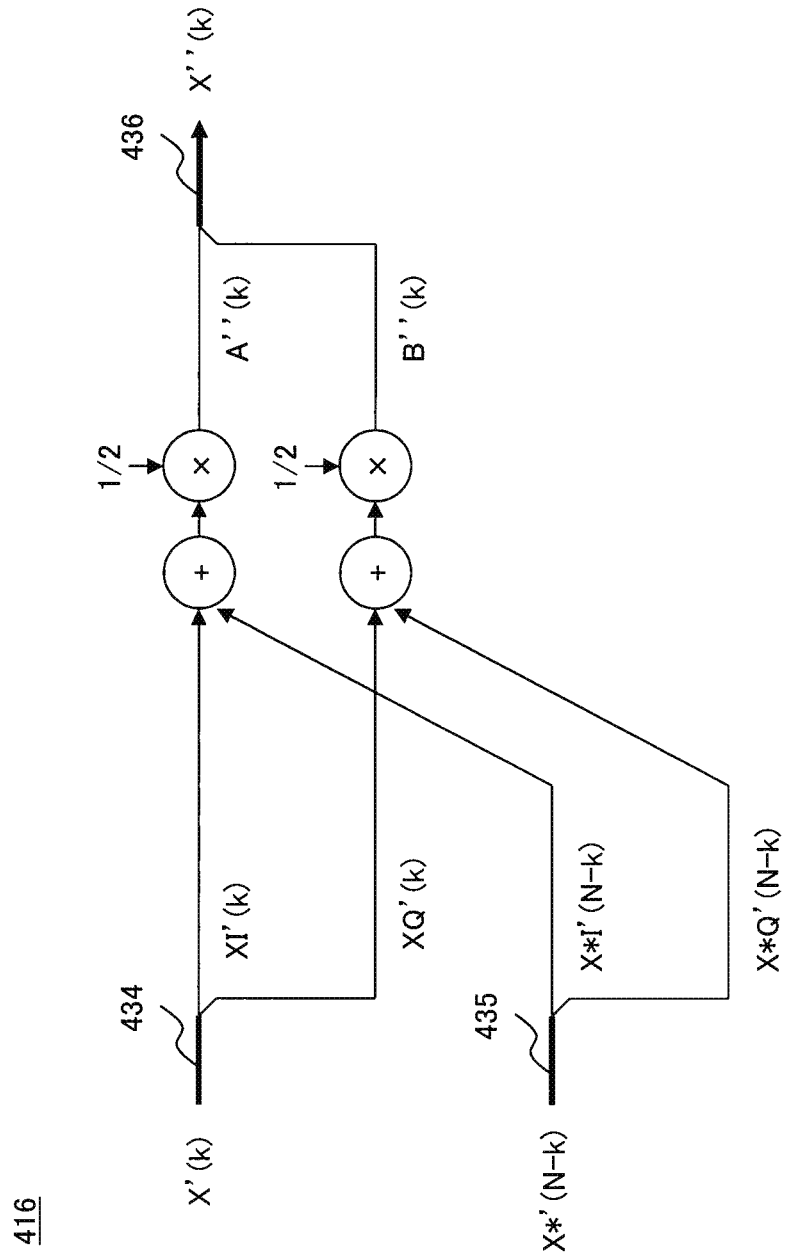
FIG. 17 is a block diagram illustrating a configuration of a complex conjugate synthesis circuit 416 in accordance with the fifth exemplary embodiment of the present invention.

FIG. 17 is a block diagram illustrating a detail configuration of the complex conjugate synthesis circuit 416. For each frequency number k satisfying 0≤k≤N−1, the complex conjugate synthesis circuit 416 inputs X′(k)(=XI′(k)+jXQ′(k); formula (14)) which the filter circuit 421 outputs as the complex signal 434 and X*′(N−k)(=X*I′(N−k)+jX*Q′(N− k); formula (17)) which the filter circuit 422 outputs as the complex signal 435, and calculates and outputs the following:

$$X''(k) = XI''(k) + jXQ''(k) \quad (20)$$
$$= 1/2\{X'(k) + X^{*\prime}(N-k)\}$$

Here, XI"(k) and XQ"(k) are a real part and an imaginary part of X"(k), respectively, which are given by the following equations:

$$XI''(k)=1/2\{XI'(k)+X^{*}I'(N-k)\} \quad (21)$$

$$XQ''(k)=1/2\{XQ'(k)+X^{*}Q'(N-k)\} \quad (22)$$

where XI'(k), XQ'(k), X*I'(N−k), and X*Q'(N−k) are expressed as described in the formulae (15), (16), (18), and (19), respectively.

Figure 18:
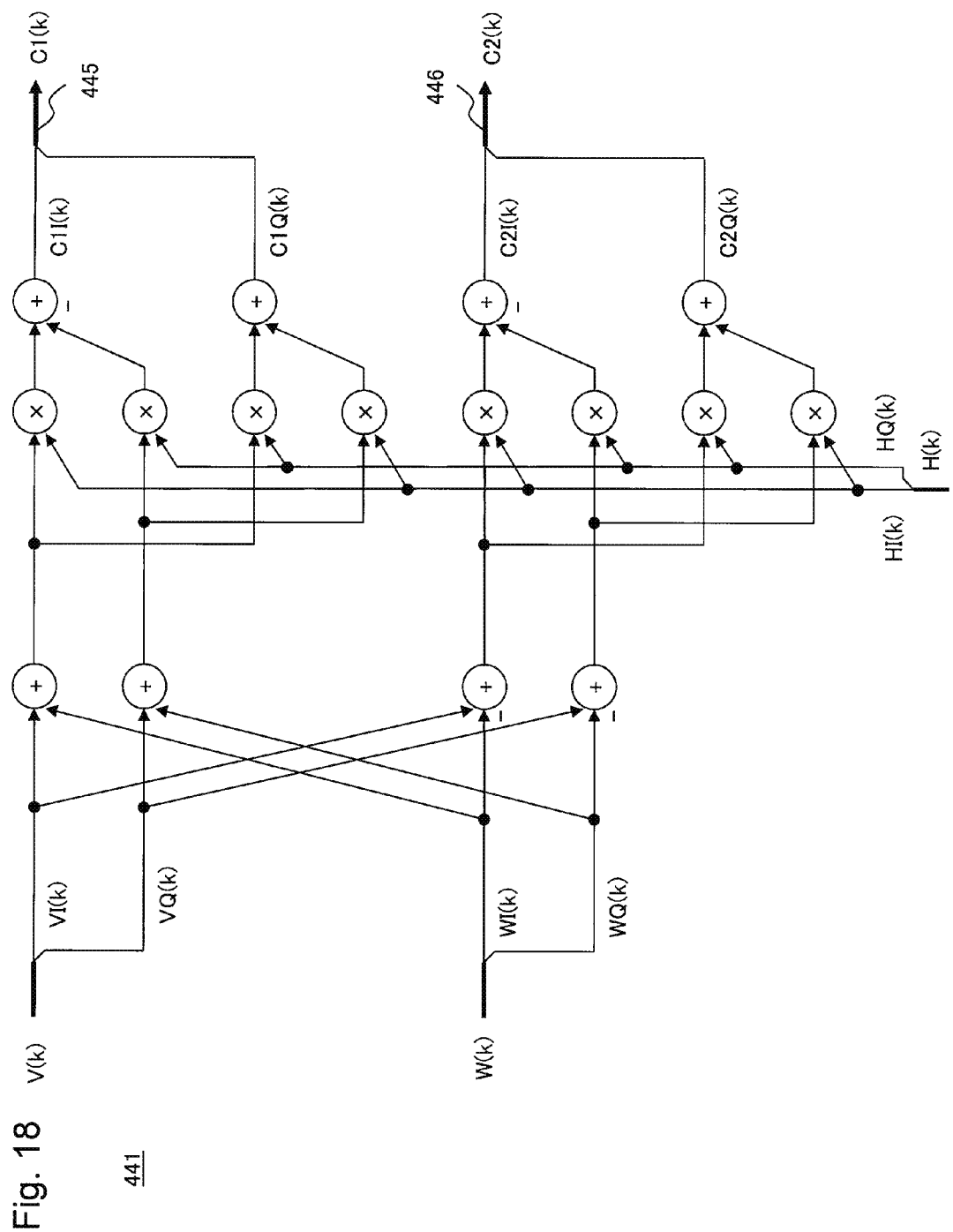
FIG. 18 is a block diagram illustrating a configuration of a filter coefficient generation circuit 441 in accordance with the fifth exemplary embodiment of the present invention.

The filter coefficient generation circuit 441 generates complex coefficients C1(k) and C2(k) to be used in the filter circuits 421 and 422. FIG. 18 is a block diagram illustrating a detail configuration of the filter coefficient generation circuit 441. For each frequency number k satisfying 0≤k≤N−1, the filter coefficient generation circuit 441 calculates V(k)+W(k) and V(k)−W(k) using the complex coefficients V(k) and W(k) inputted from an upper level circuit (not shown).

Here, $$V(k)+W(k)=VI(k)+WI(k)+jVQ(k)+jWQ(k) \quad (23)$$

$$V(k)-W(k)=VI(k)-WI(k)+jVQ(k)-jWQ(k) \quad (24)$$

VI(k) and VQ(k) are a real part and an imaginary part of V(k), respectively, and WI(k) and WQ(k) are a real part and an imaginary part of W(k), respectively.

H(k) can also be expressed separated into a real part and an imaginary part as follows:

$$H(k)=HI(k)+jHQ(k) \quad (25)$$

Next, the filter coefficient generation circuit 441 calculates and outputs the complex coefficient C1(k) and C2(k) which are defined by the following formulae:

$$C1(k) = C1I(k) + jC1Q(k) \quad (26)$$
$$= \{V(k) + W(k)\} \times H(k)$$

$$C2(k) = C2I(k) + jC2Q(k) \quad (27)$$
$$= \{V(k) - W(k)\} \times H(k)$$

where C1I(k) and C1Q(k) are a real part and an imaginary part of C1(k), respectively, and C2I(k) and C2Q(k) are a real part and an imaginary part of C2(k), respectively.

The following formula is obtained by substituting formulae (23) and (25) into formula (26):

$$C1(k)=\{VI(k)+WI(k)+jVQ(k)+jWQ(k)\}\times\{HI(k)+jHQ(k)\} \quad (28)$$

Accordingly, $$C1I(k)=\{VI(k)+WI(k)\}\times HI(k)-\{VQ(k)+WQ(k)\}\times HQ(k) \quad (29)$$

$$C1Q(k)=\{VQ(k)+WQ(k)\}\times HI(k)+\{VI(k)+WI(k)\}\times HQ(k) \quad (30)$$

Similarly, the following formula is obtained by substituting formulae (24) and (25) into formula (27):

$$C2(k) = C2I(k) + jC2Q(k) \quad (31)$$
$$= \{V(k) - W(k)\} \times H(k)$$
$$= \{VI(k) - WI(k) + jVQ(k) - jWQ(k)\} \times$$
$$\{HI(k) + jHQ(k)\}$$

Accordingly, $$C2I(k)=\{VI(k)-WI(k)\}\times HI(k)-\{VQ(k)-WQ(k)\}\times HQ(k) \quad (32)$$

$$C2Q(k)=\{VQ(k)-WQ(k)\}\times HI(k)+\{VI(k)-WI(k)\}\times HQ(k) \quad (33)$$

As described above, the digital filter circuit 400 generates a frequency-domain complex signal by performing an FFT transformation on a time-domain input signal. Then, the digital filter circuit 400 independently filters a real part and an imaginary part of the frequency-domain complex signal respectively by using two different kinds of coefficients generated from V(k), W(k), and H(k), and transforms the results into a time-domain signal through an IFFT. Thus, in the digital filter circuit 400, each of the FFT and IFFT is performed only once on a time-domain input signal.

Two different kinds of coefficients used for the filtering makes it possible to minimize the number of FFTs and IFFTs. A physical sense of V(k), W(k), and H(k), and a principle will be described below that on which it becomes possible to perform a frequency-domain filtering process equivalent to a desired filtering process in a time-domain using coefficients C1(k) and C2(k) which are generated from V(k), W(k), and H(k).

In the present embodiment, the complex conjugate generation circuit 15 generates X*(N−k) from the following frequency-domain complex signal obtained by performing a complex FFT on the inputted time-domain complex signal x(n) (=r(n)+js(n); formula (1)).

$$X(k)=R(k)+jS(k) \quad (34)$$

Here, R(k) represents a frequency-domain complex signal obtained by transforming a real part signal r(n) of a real number in time-domain through a real FFT, and S(k) represents a frequency-domain complex signal obtained by transforming an imaginary part signal s(n) of a real number in time-domain through a real FFT. Here, because of the symmetry of complex conjugates, the following formula is satisfied:

$$X^{*}(N-k)=R(k)-jS(k) \quad (35)$$

where X*(N−k) is a complex conjugate of X(N−k).

From formulae (14), (34), and (26), $$X'(k) = X(k) \times C1(k) \quad (36)$$
$$= \{R(k) + jS(k)\} \times \{V(k) + W(k)\} \times H(k)$$
$$= R(k)V(k)H(k) + R(k)W(k)H(k) +$$
$$jS(k)V(k)H(k) + jS(k)W(k)H(k)$$

From formulae (17), (35), and (27), $$X^{*\prime}(N-k) = X^*(N-k) \times C2(N-k) \quad (37)$$
$$= \{R(k) - jS(k)\} \times \{V(k) - W(k)\} \times H(k)$$
$$= R(k)V(k)H(k) - R(k)W(k)H(k) -$$
$$jS(k)V(k)H(k) + jS(k)W(k)H(k)$$

Substituting formulae (36) and (37) into formula (20), $$X''(k) = 1/2 \times \{X'(k) + X^{*\prime}(N-k)\} \quad (38)$$
$$= 1/2 \times \{2 \times R(k)V(k)H(k) + 2 \times jS(k)W(k)H(k)\}$$
$$= R(k)V(k)H(k) + jS(k)W(k)H(k)$$
$$= \{R(k)V(k) + jS(k)W(k)\} \times H(k)$$

Formula (38) expresses the signal X"(k) before the IFFT using the filter coefficients V(k), W(k), and H(k), and R(k) and S(k) in the signal X(k) after the FFT. R(k) represents a frequency-domain complex signal obtained by transforming a real part signal r(n) of a real number in time-domain through a real FFT. S(k) represents a frequency-domain complex signal obtained by transforming an imaginary part signal s(n) of a real number in time-domain through a real FFT. That is to say, formula (38) expresses filtering processes details which are performed on the signal X(k) after the FFT. Formula (38) shows that the digital filter circuit 400 performs processes equivalent to the following three filtering processes on a frequency-domain complex signal X(k) (=R(k)+jS(k); formula (34)) which is generated by transforming a complex signal x(n)=r(n)+js(n) through a real FFT.

1) A Filtering Process on R(k) Using the Coefficient V(k)

The digital filter circuit 400 first performs a filtering process using the filter coefficient V(k) on a frequency-domain complex signal R(k) obtained by transforming a time-domain real part signal r(n) through a real FFT. Therefore, V(k) is assigned a frequency-domain complex filter coefficient which corresponds to a real filter coefficient that is used when a filtering process through real number computation is performed in the time domain on a real part signal r(n).

2) A Filtering Process on S(k) Using the Coefficient W(k)

Similarly, the digital filter circuit 400 performs a filtering process using the filter coefficient W(k) on a frequency-domain complex signal S(k) obtained by transforming a time-domain imaginary part signal s(n) through a real FFT. Therefore, W(k) is assigned a frequency-domain complex filter coefficient which corresponds to a real filter coefficient that is used when a filtering process through real number computation is performed in the time domain on an imaginary part signal s(n).

3) A Filtering Process on Results of Filtering Processes 1) and 2) Using the Coefficient H(k)

Then, the digital filter circuit 400 performs a filtering process using the filter coefficient H(k) on a complex signal R(k)V(k)+jS(k)W(k) which is composed of R(k)V(k) and S(k)W(k) after the above-described two filtering processes which have been independently processed respectively.

R(k)V(k)+jS(k)W(k) represents a frequency-domain complex signal which corresponds to a time-domain signal composed of two signals obtained by performing filtering processes independently on a real part signal r(n) and an imaginary part signal s(n) in the time domain, respectively. The above-mentioned signals, which are obtained by performing filtering processes independently on a real part signal r(n) and an imaginary part signal s(n), respectively, correspond to X'(k) and X*'(N−k) in FIGS. 15 and 16. The above-mentioned time-domain signal composed of r'(n) and s'(n) corresponds to x"(n) in FIG. 13. Thus, R(k)V(k)+jS(k)W(k) represents a frequency-domain signal corresponding to a time-domain signal obtained by performing filtering processes in the time domain independently on real part and imaginary part, respectively.

Accordingly, the following coefficient can be used in order to perform on the frequency-domain signal R(k)V(k)+jS(k)W(k) a process corresponding to a filtering process by a complex computation for a time-domain complex signal. That is to say, H(k) can be assigned a frequency-domain complex filter coefficient corresponding to a complex filter coefficient which is used when a filtering process through a complex computation is performed in the time domain on the complex signal x(n).

As mentioned above, three different kinds of coefficients are set from the outside in the present exemplary embodiment. That is to say, the frequency-domain filter coefficients V(k) and W(k) are set which corresponds to time-domain filter coefficients for a real part and an imaginary part of the complex signal x(n), respectively, and the frequency-domain coefficient H(k) is set which corresponds to a time-domain filter coefficient for the x(n). It is possible to perform each of the FFT before the filtering processes and the IFFT after the filtering processes only once by performing the filtering process using two coefficients obtained from above-mentioned three coefficients.

(Effects of the Fifth Exemplary Embodiment)

As mentioned above, according to the present exemplary embodiment, the filtering process is performed which uses two different kinds of frequency-domain filter coefficients corresponding to time-domain filter coefficients for a real part and an imaginary part of a complex signal, respectively, and a frequency-domain coefficient corresponding to a time-domain filter coefficient for the complex signal. That is to say, frequency-domain filtering processes are performed which correspond to independent filtering processes by real number computation for each of a real part and an imaginary part of a time-domain complex signal, and to a filtering process by complex number computation for a time-domain complex signal. Accordingly, it is possible to realize desired filtering processes by using only one FFT circuit to perform an FFT before the filtering processes and only one IFFT circuit to perform an IFFT after the filtering processes, respectively. As a result, the present exemplary embodiment has the effect that the circuit size and the power consumption for filtering processes can be reduced.

In addition, it is possible to use the FFT circuit 10 in accordance with the first exemplary embodiment of the present invention and the IFFT circuit 20 in accordance with the second exemplary embodiment of the present invention, respectively, in order to implement FFT and IFFT circuits. Alternatively, it is possible to use the FFT circuit 30 in accordance with the third exemplary embodiment of the present invention and the IFFT circuit 40 in accordance with the fourth exemplary embodiments of the present invention, respectively, in order to implement FFT and IFFT circuits. As described above, the FFT and IFFT circuits in accordance with exemplary embodiments of the present invention can reduce the circuit size and the power consumption for FFT and IFFT processes, respectively. Therefore, there is the effect that the circuit size and the power consumption for filtering processes can be reduced by using the FFT circuit or IFFT circuit in accordance with exemplary embodiments of the present invention for a filtering process.

In the first to the fifth exemplary embodiments, it is presumed that each process such as an FFT, an IFFT, generation and synthesis of conjugate complex numbers, calculation of filter coefficients, and a filtering process, is performed by a component such as an individual circuit. However, it is also acceptable to perform the processes in the respective exemplary embodiments by means of the software using a computer included in a predetermined device, such as a digital signal processor (DSP), for example. That is to say, computer programs performing respective processes are loaded and executed by a DSP (not shown).

For example, the data sorting process can be performed by using a program. That is to say, it is also acceptable to perform the data sorting process using a DSP and a memory by controlling processes for writing data into the memory and reading data from the memory using a program.

In addition, it is also acceptable to perform using programs the FFT processing in the first or third exemplary embodiment and the IFFT processing in the second or fourth exemplary embodiment. In the fifth exemplary embodiment, it is also acceptable to perform using programs the processes for calculating C1(k) and C2(k) from V(k), W(k), and H(k), the FFT, calculating the conjugate complex number X*(N−k) of X(N−k), filtering, and the IFFT.

As described above, it is also possible by using programs to perform the same processes as those in the above-mentioned exemplary embodiments. The above-mentioned programs can be stored in a non-transitory medium including but not limited to a semiconductor storage device such as a ROM (read only memory), a RAM (random access memory), and flash memory, an optical disk, a magnetic disk, a magneto-optical disk, and the like.

Any one of the above-mentioned exemplary embodiments can be combined with one another.

The whole or part of the exemplary embodiments disclosed above can be described as, but not limited to, the following supplementary notes.

(Supplementary Note 1)

A fast Fourier transform device comprising:

a first transform unit that performs a fast Fourier transform or an inverse fast Fourier transform, generates a plurality of pieces of first output data, and outputs them in a first order; and a first data sorting processing unit that rearranges the plurality of pieces of the first output data, which have been outputted in the first order, in a second order based on an output order setting.

(Supplementary Note 2)

The fast Fourier transform device according to Supplementary note 1, wherein the first transform processing unit comprises:

a butterfly computation processing unit that performs a butterfly computation process and outputs the plurality of pieces of the first output data in the first order, and wherein the first data sorting processing unit rearranges in the second order the plurality of pieces of the first data that have undergone the butterfly computation process.

(Supplementary Note 3)

The fast Fourier transform device according to Supplementary note 1 or 2, wherein the first data sorting processing unit comprises:

a first storage unit that stores the plurality of pieces of the first output data; and a read address generation unit that generates a read address for reading the plurality of pieces of the first output data from the first storage unit based on the output order setting, and stores the plurality of pieces of the first output data in the first order and reads them in the second order.

(Supplementary Note 4)

The fast Fourier transform device according to any one of Supplementary notes 1 to 3, wherein, assuming that the plurality of pieces of the first output data are represented by X(k) (where k is an integer satisfying 0≤k≤N−1, and N is the number of points for a fast Fourier transform or an inverse fast Fourier satisfying N>0), the first data sorting processing unit outputs X(k) and X(N−k) for any k in a time lag as few as one cycle or less.

(Supplementary Note 5)

A fast Fourier transform device comprising:

a second data sorting processing unit that rearranges a plurality of pieces of second input data, which have been inputted in a third order, in a fourth order based on an input order setting; and a second transform unit that performs a fast Fourier transform or an inverse fast Fourier transform on the plurality of pieces of the second data rearranged in the fourth order.

(Supplementary Note 6)

The fast Fourier transform device according to Supplementary note 5, wherein the second transform processing unit comprises:

a butterfly computation processing unit that performs a butterfly computation process, and wherein the second data sorting processing unit inputs the plurality of pieces of the second data to the butterfly computation processing unit in the fourth order.

(Supplementary Note 7)

The fast Fourier transform device according to Supplementary note 5 or 6, wherein the second data sorting processing unit comprises:

a second storage unit that stores the plurality of pieces of the second input data; and a write address generation unit that generates a write address for writing the plurality pieces of the second data into the second storage unit based on the input order setting, and stores the plurality of pieces of the second output data in the third order and reads them in the fourth order.

(Supplementary Note 8)

The fast Fourier transform device according to any one of Supplementary notes 5 to 7, wherein, assuming that the plurality of pieces of the first input data are represented by X(k) (where k is an integer satisfying 0≤k≤N−1, and N is the number of points for a fast Fourier transform or an inverse fast Fourier satisfying N>0), the second data sorting processing unit inputs X(k) and X(N−k) for any k in a time lag as few as one cycle or less to the butterfly computation processing unit.

(Supplementary Note 9)

A digital filter device comprising the fast Fourier transform device according to Supplementary note 1 or 5.

(Supplementary Note 10)

A digital filter device comprising:

the fast Fourier transform device according to Supplementary note 1;

a complex conjugate generation unit that generates second complex data, the data comprising conjugate complex numbers corresponding to their respective complex numbers, all of which constitute a plurality of pieces of frequency-domain first complex data that have been generated through a Fourier transform by the fast Fourier transform device on the plurality of pieces of the first input data that are time-domain inputted complex numbers;

a filter coefficient generation unit that generates a first and a second frequency-domain filter coefficients of complex numbers from a first and a second and a third input filter coefficients of complex numbers that have been inputted;

a first filter unit that performs a filtering process on the first complex data with the first frequency-domain filter coefficient and outputs third complex data;

a second filter unit that performs a filtering process on the second complex data with the second frequency-domain filter coefficient and outputs fourth complex data; and a complex conjugate synthesis unit that generates fifth complex data by synthesizing from the third complex signal and the fourth complex signal.

(Supplementary Note 11)

The digital filter device according to Supplementary note 10, comprising:

the fast Fourier transform device according to Supplementary note 5, wherein the second data sorting processing unit rearranges the fifth complex data, which has been inputted in the third order, in the fourth order based on the input order setting, and wherein the second transform unit performs an inverse Fourier transform on the fifth complex data rearranged in the fourth order to convert the fifth complex data into time-domain signals.

(Supplementary Note 12)

The digital filter device according to Supplementary note 10 or 11, wherein, assuming that the number of transform samples in the Fourier transform or the inverse Fourier transform is represented by N (where N is an integer satisfying N>0), the complex conjugate generation unit generates, as the second complex data, a complex conjugate number of a complex number for a frequency number (N−k) included in the first complex data.

(Supplementary Note 13)

The digital filter device according to Supplementary note 12, wherein the complex conjugate synthesis unit generates the fifth complex signal through a complex addition where a first complex number for a frequency number k included in the third complex data is added to a second complex number for a frequency number (N−k) included in the fourth complex data, for each frequency number k satisfying $0 \leq k \leq N-1$.

(Supplementary Note 14)

The digital filter device according to any one of Supplementary notes 10 to 13, wherein the filter coefficient generation unit generates the first frequency-domain filter coefficient through a complex addition where the second input filter coefficient is added to the first input filter coefficient, and then through a complex multiplication by the third input filter coefficient, and generates the second frequency-domain filter coefficient through a complex subtraction where the second input filter coefficient is subtracted from the first input filter coefficient and then through a complex multiplication by the third input filter coefficient.

(Supplementary Note 15)

The digital filter device according to any one of Supplementary notes 10 to 14, wherein the first frequency-domain filter coefficient is a complex filter coefficient in the frequency domain corresponding to a filter coefficient for a real part of the complex input signal in a time-domain filtering process, which is a filtering process in the time domain performed on the first input data, and wherein the second frequency-domain filter coefficient is a complex filter coefficient in the frequency domain corresponding to a filter coefficient for an imaginary part of the first input data in the time-domain filtering process, and wherein the third frequency-domain filter coefficient is a complex filter coefficient in the frequency domain corresponding to a filter coefficient for the first input data in the time-domain filtering process.

(Supplementary Note 16)

A fast Fourier transform method that rearranges, based on an output order setting, a plurality of pieces of output data generated through a fast Fourier transform or an inverse fast Fourier transform, or rearranges, based on an input order setting, a plurality of pieces of input data to the fast Fourier transform or the inverse fast Fourier transform.

(Supplementary Note 17)

A non-transitory storage medium that stores a fast Fourier transform program causing a computer included in a fast Fourier transform device to function as:

means that performs a fast Fourier transform or an inverse fast Fourier transform; and sorting means that rearranges a plurality of pieces of output data generated through the fast Fourier transform or the inverse fast Fourier transform, based on an output order setting; or sorting means that rearranges a plurality of pieces of input data to the fast Fourier transform or the inverse fast Fourier transform, based on an input order setting.

The present invention has been described with reference to exemplary embodiments, but the present invention is not limited to the aforementioned exemplary embodiments. Various modifications of the present invention that could be understood by those skilled in the art can be made to configurations or details of the present invention within the scope of the invention.

The present application is based upon and claims the benefit of priority from Japanese Patent Application No. 2013-010183, filed on Jan. 23, 2013, the disclosure of which is incorporated herein in its entirety by reference.

REFERENCE SIGNS LIST 10, 30 FFT device
20, 40 IFFT device
11, 12, 13, 14, 15, 16, 17 Data sorting processing unit
21, 22 Butterfly computation processing unit
31 Twiddle multiplication processing unit
41, 43 Read address generation unit
42, 44 Write address generation unit
51, 55 Read address
52, 56 Output order setting
53, 57 Write address
54, 58 Input order setting
60, 60, 80 Fast Fourier transform device
61, 72 Fourier transform unit
62, 71, 83 Data sorting processing unit
81, 82 Processing unit
100, 200, 300 Data sorting processing unit
101a to 101h Data storage location
102a to 102h Data read location
201a to 201h Data storage location 301a to 301h Data storage location
400 Digital filter circuit
413 FFT circuit
414 IFFT circuit
415 Complex conjugate generation circuit
416 Complex conjugate synthesis circuit
421 Filter circuit
422 Filter circuit
431 to 436 Complex signal
441 Filter coefficient generation circuit
445, 446 Complex signal
500 Dataflow
501 Data sorting process
502, 503 Butterfly computation process
504 Twiddle computation process
505 Partial dataflow
600 FFT device
601 FFT unit
602 Data sorting processing unit

What is claimed is:

1. A digital filter device, comprising:
at least one hardware processor configured to implement:
a fast Fourier transform device, the fast Fourier transform device comprising a first transform unit and a first data sorting processing unit
the first transform unit performing one of a fast Fourier transform and an inverse fast Fourier transform, generating a plurality of first output data, and outputting the plurality of first output data in a first order, and
the first data sorting processing unit rearranging the plurality of the first output data outputted in the first order, in a second order based on an output order setting;
a complex conjugate generation unit generating second complex data, the second complex data including respective conjugate complex numbers of complex numbers, all of which composing a plurality of frequency-domain first complex data generated by Fourier-transforming a plurality of first input data of inputted time-domain complex numbers by the fast Fourier transform device;
a filter coefficient generation unit generating a first and a second frequency-domain filter coefficients of complex numbers from a first, a second, and a third input filter coefficients of inputted complex numbers;
a first filter unit performing a filtering process on the first complex data with the first frequency-domain filter coefficient and outputting third complex data;
a second filter unit performing a filtering process on the second complex data with the second frequency-domain filter coefficient and outputting fourth complex data; and
a complex conjugate synthesis unit generating fifth complex data by synthesizing the third complex signal and the fourth complex signal.

2. The digital filter device according to claim 1, wherein the first transform unit includes a butterfly computation processing unit performing a butterfly computation process and outputting the plurality of the first output data in the first order, and
the first data sorting unit rearranges in the second order the plurality of the first data after the butterfly computation process.

3. The digital filter device according to claim 1,
wherein the first data sorting processing unit includes
a first storage unit storing the plurality of the first output data, and
a read address generation unit generating a read address to read the plurality of the first output data from the first storage unit based on the output order setting,
and stores the plurality of the first output data in the first order and reads the plurality of the first output data in the second order.

4. The digital filter device according to claim 1,
wherein the first data sorting processing unit outputs X(k) and X(N−k) at a time lag within one cycle at most for any k, X(k) representing the plurality of the first output data, k representing an integer satisfying $0 \leq k \leq N-1$, and N representing the number of points satisfying $N>0$ for one of a fast Fourier transform and an inverse fast Fourier transform.

5. The digital filter device according to claim 1, wherein the at least one hardware processor is further configured to implement:
a second data sorting processing unit rearranging a plurality of second input data inputted in a third order, in a fourth order based on an input order setting; and
a second transform unit performing one of a fast Fourier transform and an inverse fast Fourier transform on the plurality of the second input data rearranged in the fourth order,
wherein the second data sorting processing means unit rearranges the fifth complex data inputted in the third order, in the fourth order based on the input order setting,
and the second transform means unit performs an inverse Fourier transform on the fifth complex data rearranged in the fourth order and converts the fifth complex data into time-domain signals.

6. The digital filter device according to claim 2,
wherein the first data sorting processing unit includes
a first storage unit storing the plurality of the first output data, and
a read address generation unit generating a read address to read the plurality of the first output data from the first storage unit based on the output order setting,
and stores the plurality of the first output data in the first order and reads the plurality of the first output data in the second order.

7. The digital filter device according to claim 2,
wherein the first data sorting processing unit outputs X(k) and X(N−k) at a time lag within one cycle at most for any k, X(k) representing the plurality of the first output data, k representing an integer satisfying $0 \leq k \leq N-1$, and N representing the number of points satisfying $N>0$ for one of a fast Fourier transform and an inverse fast Fourier transform.

8. The digital filter device according to claim 3,
wherein the first data sorting processing unit outputs X(k) and X(N−k) at a time lag within one cycle at most for any k, X(k) representing the plurality of the first output data, k representing an integer satisfying $0 \leq k \leq N-1$, and N representing the number of points satisfying $N>0$ for one of a fast Fourier transform and an inverse fast Fourier transform.

9. A digital filter method, comprising:
performing a process for rearranging, based on an output order setting, a plurality of output data generated by one of a fast Fourier transform and an inverse fast Fourier transform;

generating second complex data, the second complex data including respective conjugate complex numbers of complex numbers, all of which composing a plurality of frequency-domain first complex data generated by Fourier-transforming a plurality of first input data of inputted time-domain complex numbers by a fast Fourier transform device;

generating a first and a second frequency-domain filter coefficients of complex numbers from a first, a second, and a third input filter coefficients of inputted complex numbers;

performing a filtering process on the first complex data with the first frequency-domain filter coefficient and outputting third complex data;

performing a filtering process on the second complex data with the second frequency-domain filter coefficient and outputting fourth complex data; and generating fifth complex data by synthesizing the third complex signal and the fourth complex signal.

\* \* \* \* \*